United States Patent
Cheng et al.

(10) Patent No.: US 11,038,044 B2
(45) Date of Patent: Jun. 15, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chao-Ching Cheng, Hsinchu (TW); Hung-Li Chiang, Taipei (TW); Tzu-Chiang Chen, Hsinchu (TW); I-Sheng Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/585,278

(22) Filed: Sep. 27, 2019

(65) Prior Publication Data
US 2020/0044061 A1    Feb. 6, 2020

Related U.S. Application Data

(62) Division of application No. 16/396,405, filed on Apr. 26, 2019.
(Continued)

(51) Int. Cl.
*H01L 29/66*    (2006.01)
*H01L 29/08*    (2006.01)
(Continued)

(52) U.S. Cl.
CPC .... *H01L 29/66795* (2013.01); *H01L 21/0217* (2013.01); *H01L 21/02532* (2013.01);
(Continued)

(58) Field of Classification Search
None
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| (Continued) | | |

FOREIGN PATENT DOCUMENTS

| CN | 108269849 A | 7/2018 |
| KR | 10-2016-0011171 A | 1/2016 |
| (Continued) | | |

OTHER PUBLICATIONS

Non-Final Office Action issued in related U.S. Appl. No. 16/396,405, dated Sep. 23, 2020.

*Primary Examiner* — Hsien Ming Lee
(74) *Attorney, Agent, or Firm* — McDermott Will & Emery LLP

(57) ABSTRACT

In a method of manufacturing a semiconductor device, a fin structure, in which first semiconductor layers and second semiconductor layers are alternately stacked, is formed over a bottom fin structure. A sacrificial gate structure having sidewall spacers is formed over the fin structure. A source/drain region of the fin structure, which is not covered by the sacrificial gate structure, is removed. The second semiconductor layers are laterally recessed. Dielectric inner spacers are formed on lateral ends of the recessed second semiconductor layers. The first semiconductor layers are laterally recessed. A source/drain epitaxial layer is formed to contact lateral ends of the recessed first semiconductor layer. The second semiconductor layers are removed thereby releasing the first semiconductor layers in a channel region. A gate structure is formed around the first semiconductor layers.

20 Claims, 29 Drawing Sheets

Related U.S. Application Data

(60) Provisional application No. 62/712,868, filed on Jul. 31, 2018.

(51) Int. Cl.

| | | |
|---|---|---|
| *H01L 21/311* | (2006.01) | |
| *H01L 21/02* | (2006.01) | |
| *H01L 29/165* | (2006.01) | |
| *H01L 29/06* | (2006.01) | |
| *H01L 27/088* | (2006.01) | |
| *H01L 29/423* | (2006.01) | |
| H01L 21/308 | (2006.01) | |
| H01L 21/265 | (2006.01) | |
| H01L 29/10 | (2006.01) | |

(52) U.S. Cl.
CPC .... *H01L 21/31116* (2013.01); *H01L 27/0886* (2013.01); *H01L 29/0673* (2013.01); *H01L 29/0847* (2013.01); *H01L 29/165* (2013.01); *H01L 29/42392* (2013.01); *H01L 29/6656* (2013.01); *H01L 29/66545* (2013.01); *H01L 29/66553* (2013.01); *H01L 29/66636* (2013.01); *H01L 21/26513* (2013.01); *H01L 21/3081* (2013.01); *H01L 21/3086* (2013.01); *H01L 29/1083* (2013.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,583,399 | B1 | 2/2017 | Chen et al. |
| 9,608,116 | B2 | 3/2017 | Ching et al. |
| 9,991,352 | B1 | 6/2018 | Frougier et al. |
| 10,164,012 | B2 * | 12/2018 | Fung ................ H01L 29/42392 |
| 10,211,307 | B2 * | 2/2019 | Ching ................ H01L 29/6653 |
| 10,263,100 | B1 | 4/2019 | Bi et al. |
| 10,355,102 | B2 * | 7/2019 | Cheng ................ H01L 29/66772 |
| 10,714,592 | B2 * | 7/2020 | Cheng ................ H01L 29/775 |
| 2014/0339507 | A1 | 11/2014 | Leobandung |
| 2016/0020305 | A1 | 1/2016 | Obradovic et al. |
| 2017/0271477 | A1 | 9/2017 | Palle et al. |
| 2018/0047853 | A1 | 2/2018 | Chang et al. |
| 2018/0083113 | A1 | 3/2018 | Balakrishnan et al. |
| 2018/0122900 | A1 | 5/2018 | Cheng et al. |
| 2018/0190829 | A1 | 7/2018 | Song et al. |
| 2018/0197794 | A1 | 7/2018 | Kang et al. |
| 2018/0358435 | A1 | 12/2018 | Mochizuki et al. |
| 2019/0027570 | A1 * | 1/2019 | Ching ................ H01L 29/66439 |
| 2019/0067418 | A1 * | 2/2019 | Yang ................ H01L 29/0673 |
| 2019/0067441 | A1 * | 2/2019 | Yang ................ H01L 29/1079 |
| 2019/0123163 | A1 * | 4/2019 | Yang ................ H01L 29/0847 |
| 2019/0131431 | A1 * | 5/2019 | Cheng ................ H01L 29/0847 |
| 2019/0148515 | A1 * | 5/2019 | Cheng ................ H01L 29/0847 257/347 |
| 2019/0341469 | A1 * | 11/2019 | Cheng ................ H01L 29/045 |
| 2020/0044060 | A1 * | 2/2020 | Cheng ................ H01L 21/0217 |
| 2020/0052084 | A1 * | 2/2020 | Ching ................ H01L 29/66795 |
| 2020/0135587 | A1 * | 4/2020 | Cheng ................ H01L 29/42384 |
| 2020/0227534 | A1 * | 7/2020 | Chiang ................ H01L 21/82381 |
| 2020/0251555 | A1 * | 8/2020 | Yang ................ H01L 29/0653 |

FOREIGN PATENT DOCUMENTS

| | | |
|---|---|---|
| KR | 10-2017-0107364 A | 9/2017 |
| KR | 10-2018-0080527 A | 7/2018 |
| KR | 10-2018-0082317 A | 7/2018 |
| TW | 201730837 A | 9/2017 |
| TW | 201730937 A | 9/2017 |
| TW | 201732894 A | 9/2017 |
| TW | 201735179 A | 10/2017 |

* cited by examiner

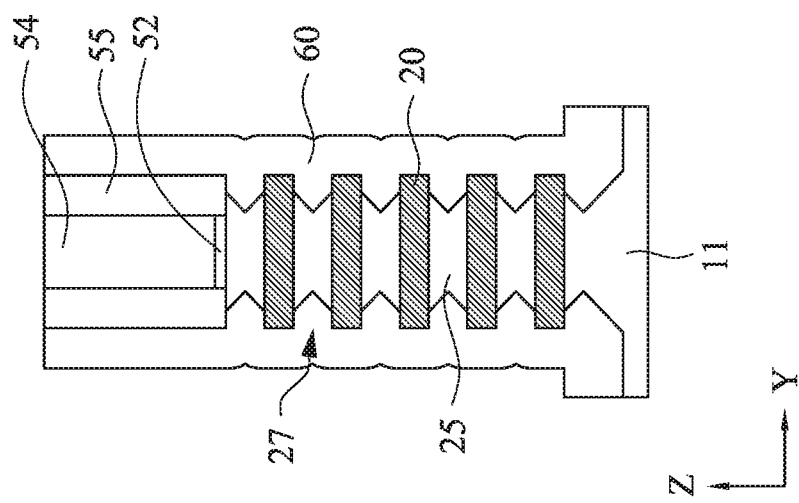
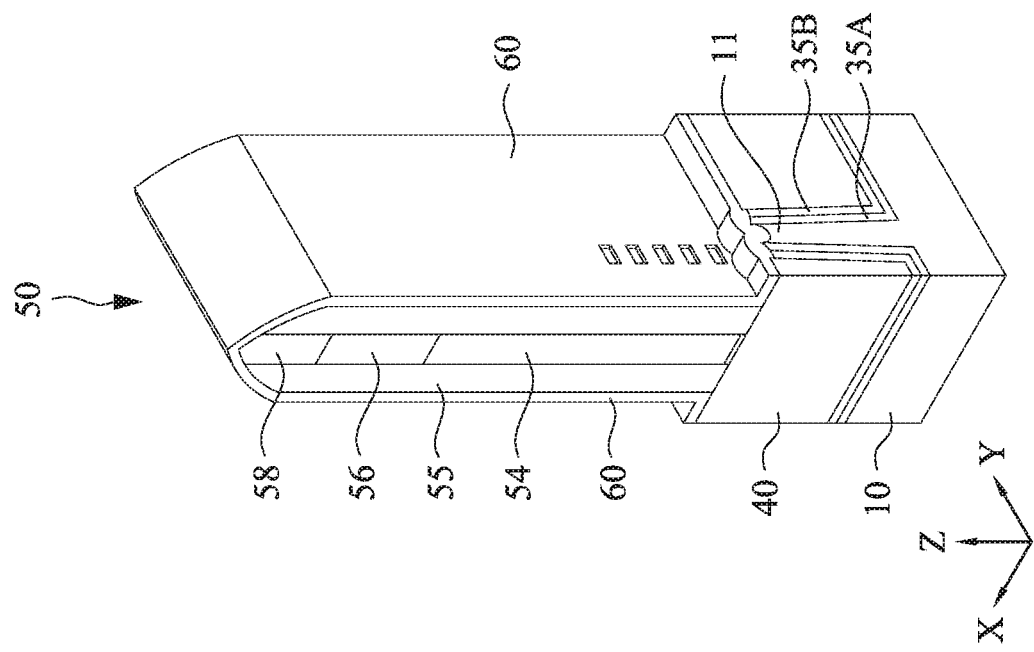
FIG. 14B
FIG. 14A

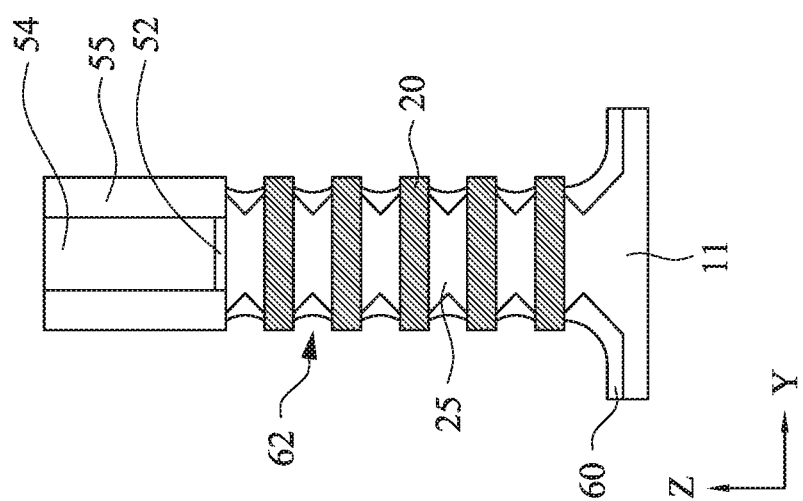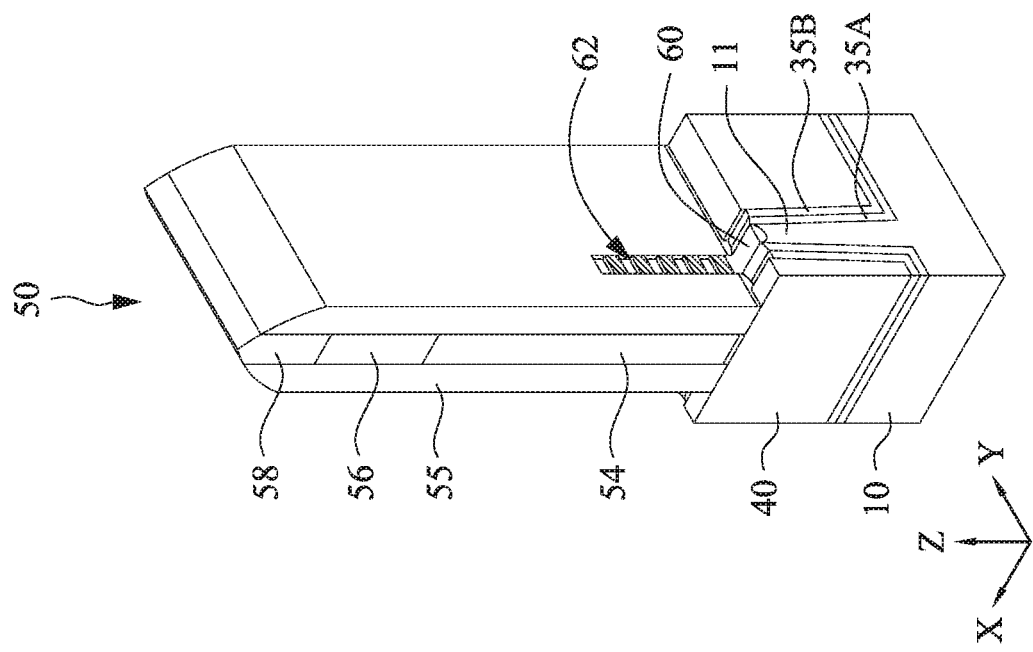
FIG. 15B
FIG. 15A

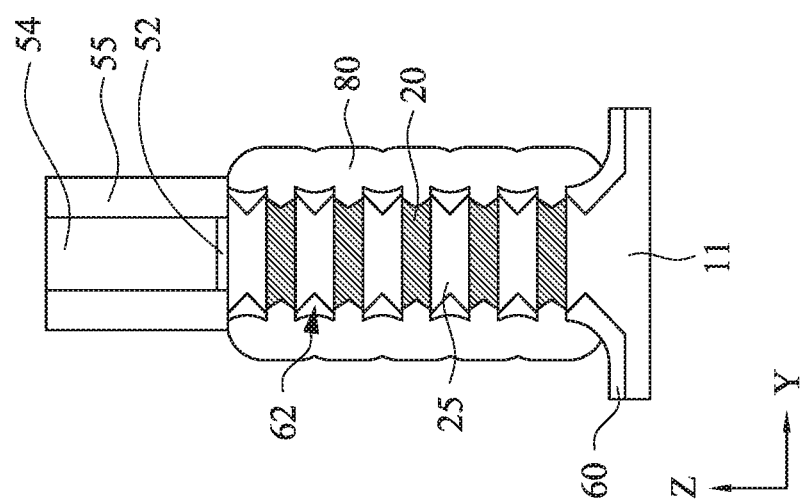
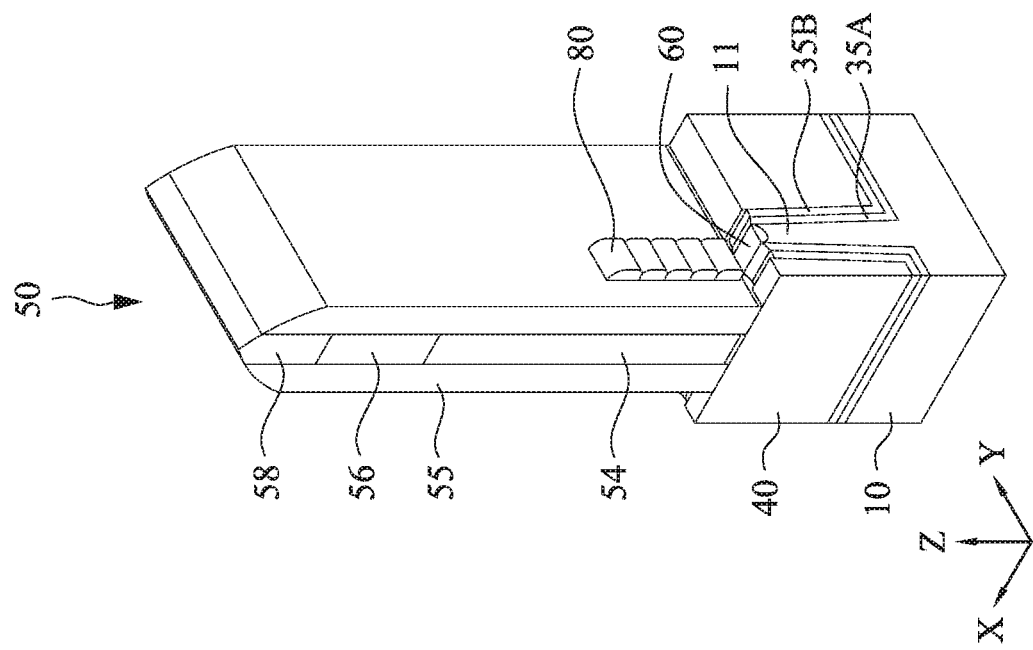

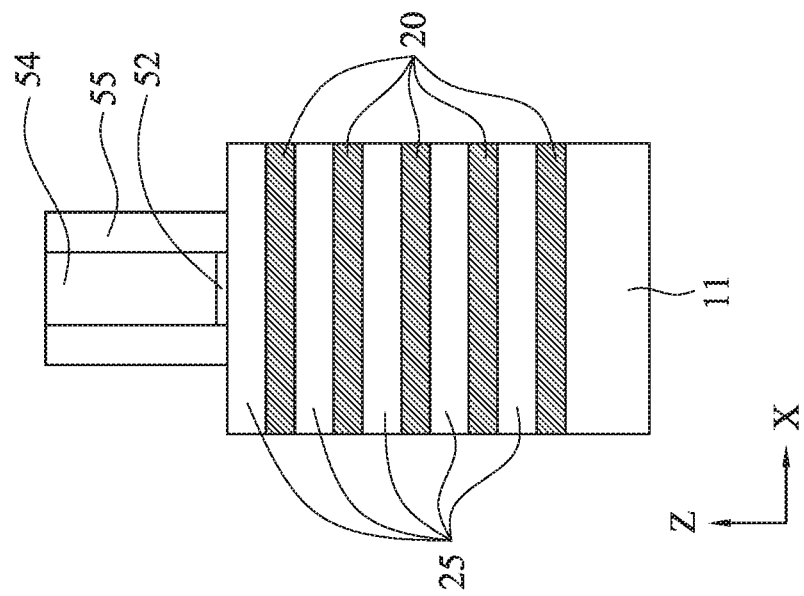
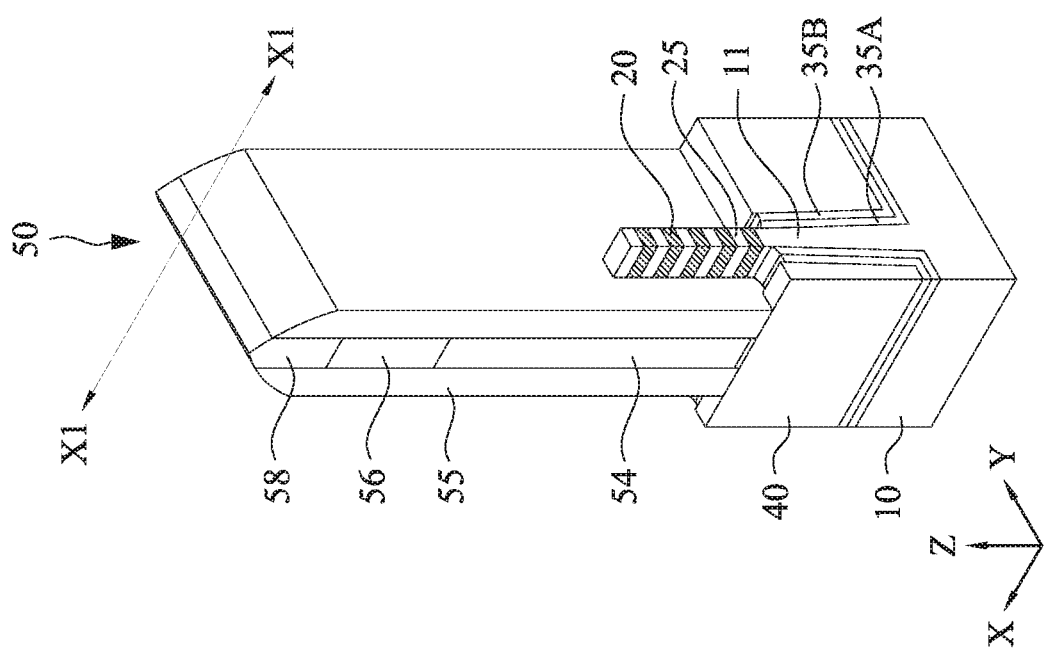
FIG. 22A
FIG. 22B

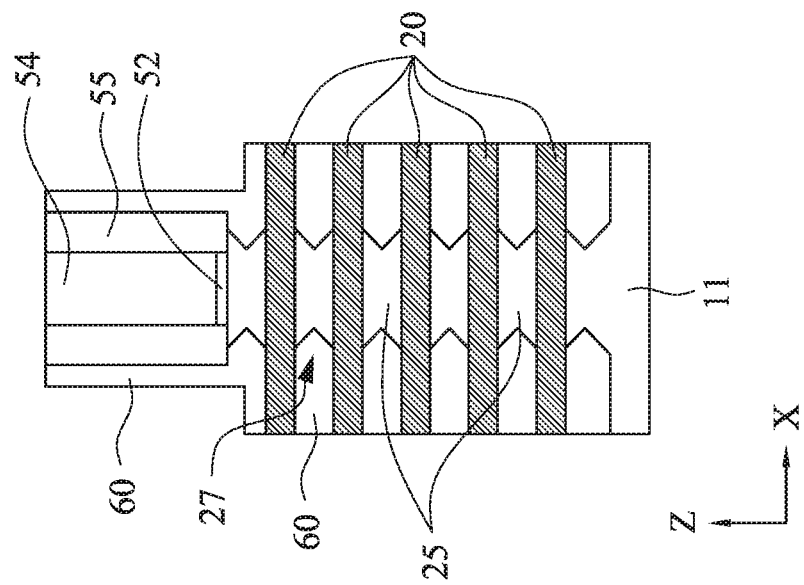
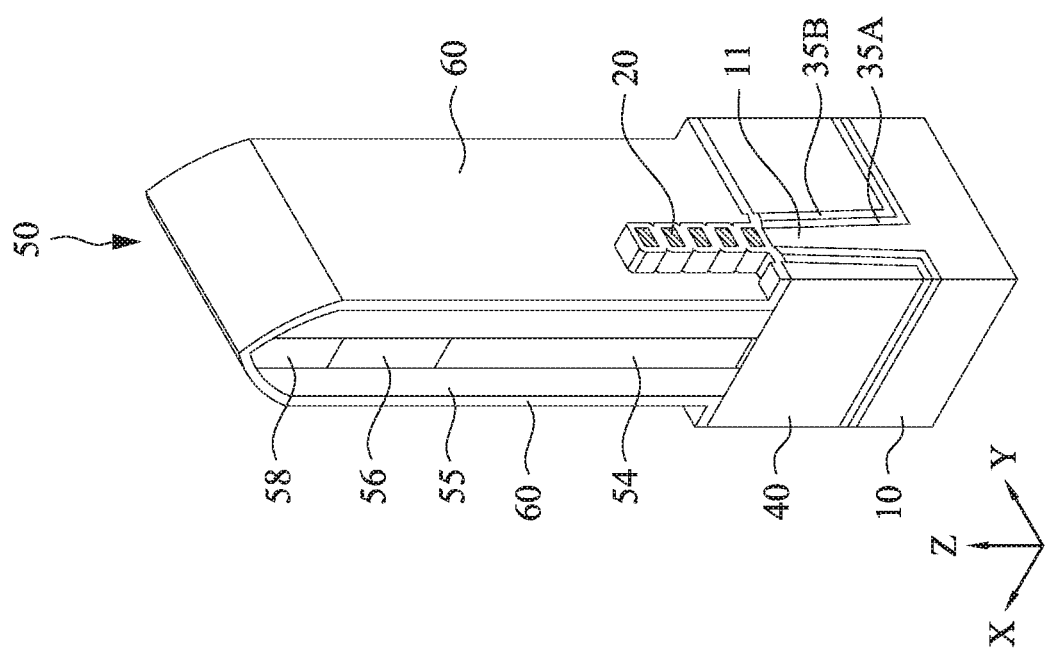
FIG. 24B
FIG. 24A

US 11,038,044 B2

SEMICONDUCTOR DEVICE AND MANUFACTURING METHOD THEREOF

RELATED APPLICATION

This application is a divisional of application Ser. No. 16/396,405 filed on Apr. 26, 2019, which claims priority of U.S. Provisional Patent Application No. 62/712,868 filed on Jul. 31, 2018, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14A and 14B show views of one of the various stages of a sequential manufacturing process for a GAA FET device according to an embodiment of the present disclosure.

FIGS. 15A and 15B show views of one of the various stages of a sequential manufacturing process for a GAA FET device according to an embodiment of the present disclosure.

FIGS. 17A and 17B show views of one of the various stages of a sequential manufacturing process for a GAA FET device according to an embodiment of the present disclosure.

FIGS. 22A and 22B show views of one of the various stages of a sequential manufacturing process for a GAA FET device according to another embodiment of the present disclosure.

FIGS. 24A and 24B show views of one of the various stages of a sequential manufacturing process for a GAA FET device according to another embodiment of the present disclosure.

DETAILED DESCRIPTION

Figure 1A:
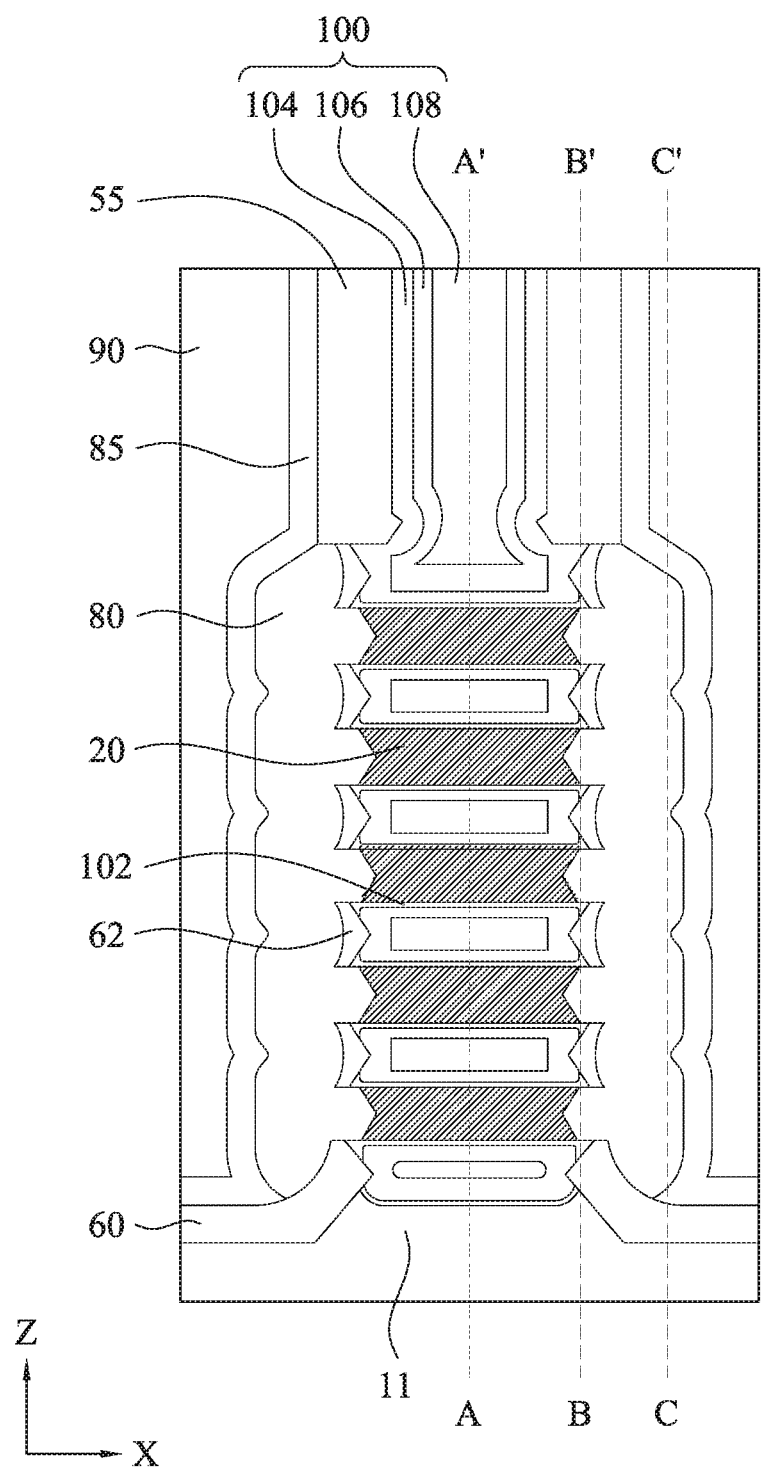
FIGS. 1A, 1B, 1C and 1D show various views of a GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the following embodiments, material, configurations, dimensions, operations and/or processes of one embodiment may be employed in another embodiment, unless otherwise described, and detailed explanation thereof may be omitted.

High mobility channel materials and device architectures have been studied to extend the life of Moore's law in recent 10 years. Pure Ge and SiGe having a high Ge concentration are promising candidates for such materials due to their material property of higher intrinsic hole and electron mobility. For well-tempered device scaling of Lg<12 nm, nanowire or nanosheet structures will be employed to provide better short channel controlling. Therefore, Ge or SiGe nanowire devices are considered as promising and potential candidates for further scaled-down logic device application. For superior Ge nanowire device performance, there are several issues to be solved, for example, (1) high interfacial state density (Dit) under gate sidewall spacers and (2) high device leakage current due to narrow band-gap of Ge (0.66 eV), relative to Si (1.2 eV).

In the present disclosure, a device structure and a method of manufacturing thereof to solve the issues as set forth above are presented.

Figure 1D:
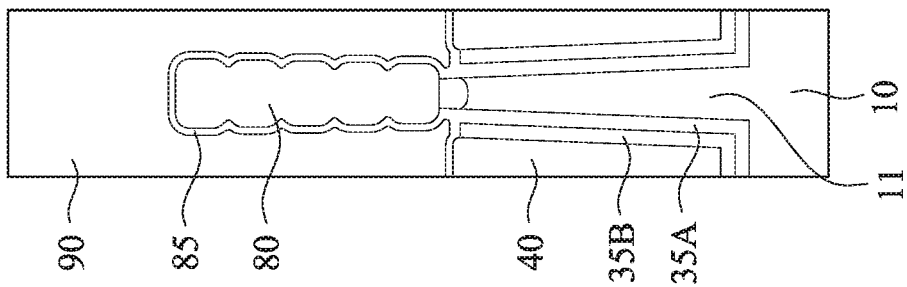
Figure 1C:
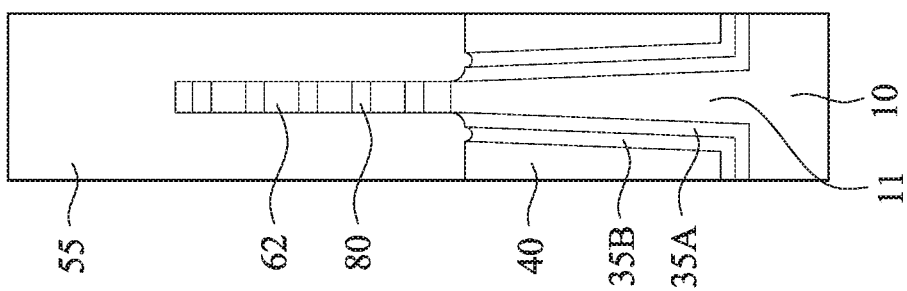
Figure 1B:
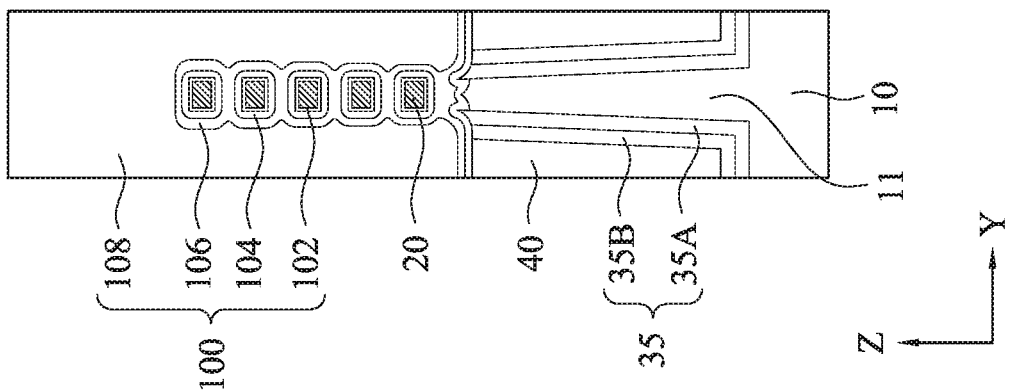

FIG. 1A-1D show various views of a GAA FET device according to an embodiment of the present disclosure. FIG. 1A shows a cross sectional view along the X direction, in which a fin structure and channels (nanowires) extend. FIGS. 1B, 1C and 1D show cross sectional views along the Y direction, in which a gate electrode extends. FIG. 1B is the cross sectional view corresponding to line A-A' of FIG. 1A cutting the center of channels. FIG. 1C is the cross sectional view corresponding to line B-B' of FIG. 1A cutting the center of a gate sidewall spacer. FIG. 1D is the cross sectional view corresponding to line C-C' of FIG. 1A cutting a source/drain epitaxial layer. In some embodiments, the GAA FET is n-channel FET.

As shown in FIGS. 1A-1D, a bottom fin structure 11 is disposed over a substrate 10. A plurality of semiconductor wires 20, as channels, are vertically arranged over the bottom fin structure 11. Although five semiconductor wires 20 are shown in FIGS. 1A and 1B, the number of vertically arranged semiconductor wires 20 is not limited to five, and it can be as small as one and up to 15-20. In some embodiments, the semiconductor wires 20 are made of $Si_{1-x}Ge_x$, where x is equal to or more than about 0.5, or Ge (x=1.0). In some embodiments, one or more fin liner layers 35 are disposed on side faces of the bottom fin structure 11. In certain embodiments, the fin liner layers 35 include a first fin liner layer 35A disposed in contact with the bottom fin structure 11 and a second fin liner layer 35B made of a different material than the first fin liner layer 35A and disposed over the first fin liner layer 35A. In some embodiments, at least the uppermost portion of the bottom fin structure 11 includes a layer made of SiGe.

A gate structure 100 includes a gate dielectric layer 104 wrapping around the semiconductor wires 20 and a gate electrode layer 108 disposed over the gate dielectric layer 104. In some embodiments, an interfacial layer 102 is disposed between the gate dielectric layer 104 and the semiconductor wires 20. In some embodiments, one or more work function adjustment layers 106 are disposed between the gate electrode layer 108 and the gate dielectric layer 104. In some embodiments, the gate electrode layer 108 is not disposed between the semiconductor nanowires 20 and the work function adjustment layer 106 fill gaps between adjacent semiconductor wires 20. In other embodiments, the gate electrode layer 108 wraps around the semiconductor wires, as well as the interfacial layer 102, the gate dielectric layer 104 and the work function adjustment layer 106. Further, as shown in FIGS. 1A and 1C, gate sidewall spacers 55 are disposed opposing side faces of the gate structure 100.

Further, a source/drain epitaxial layer 80 is disposed to be connected to horizontal ends of the semiconductor wires 20. As shown in FIG. 1A, the horizontal ends of the semiconductor wires 20 have a concave V-shape or U-Shape. A liner layer 85, which may be a contact etch stop layer (CESL), is disposed over the source/drain epitaxial layer 80, and an interlayer dielectric (ILD) layer 90 is disposed over the liner layer 85. In some embodiments, the source/drain epitaxial layer 80 is made of a semiconductor material having a higher energy band gap than the semiconductor material of the semiconductor wires 20. In certain embodiments, the source/drain epitaxial layer 80 is made of Si doped with P (SiP).

The GAA FET shown in FIGS. 1A-1D further includes dielectric inner spacers 62 disposed between the gate structure 100 disposed between adjacent semiconductor wires 20 and the source/drain epitaxial layer 80. Further, a dielectric layer 60 made of the same material as the dielectric inner spacers 62 is disposed between the source/drain epitaxial layer 80 and the bottom fin structure 11.

In some embodiments, as shown in FIG. 1A, the interface between at least one of the semiconductor wires 20 and the source/drain epitaxial layer 80 is located under one of the gate sidewall spacers 55. In certain embodiments, the location under one of the gate sidewall spacers 55 corresponds to a cross section (Y-Z plane) cutting the center of the gate sidewall spacer 55 in the X direction. In some embodiments, the interface is located closer to the gate structure 100 than the center line (line B-B' of FIG. 1A) of the gate sidewall spacer 55. In some embodiments, an entirety of the dielectric inner spacers 62 is located under the gate sidewall spacers 55.

In some embodiments, the gate sidewall spacers 55 are not in contact with the semiconductor wires 20.

Figure 2A:
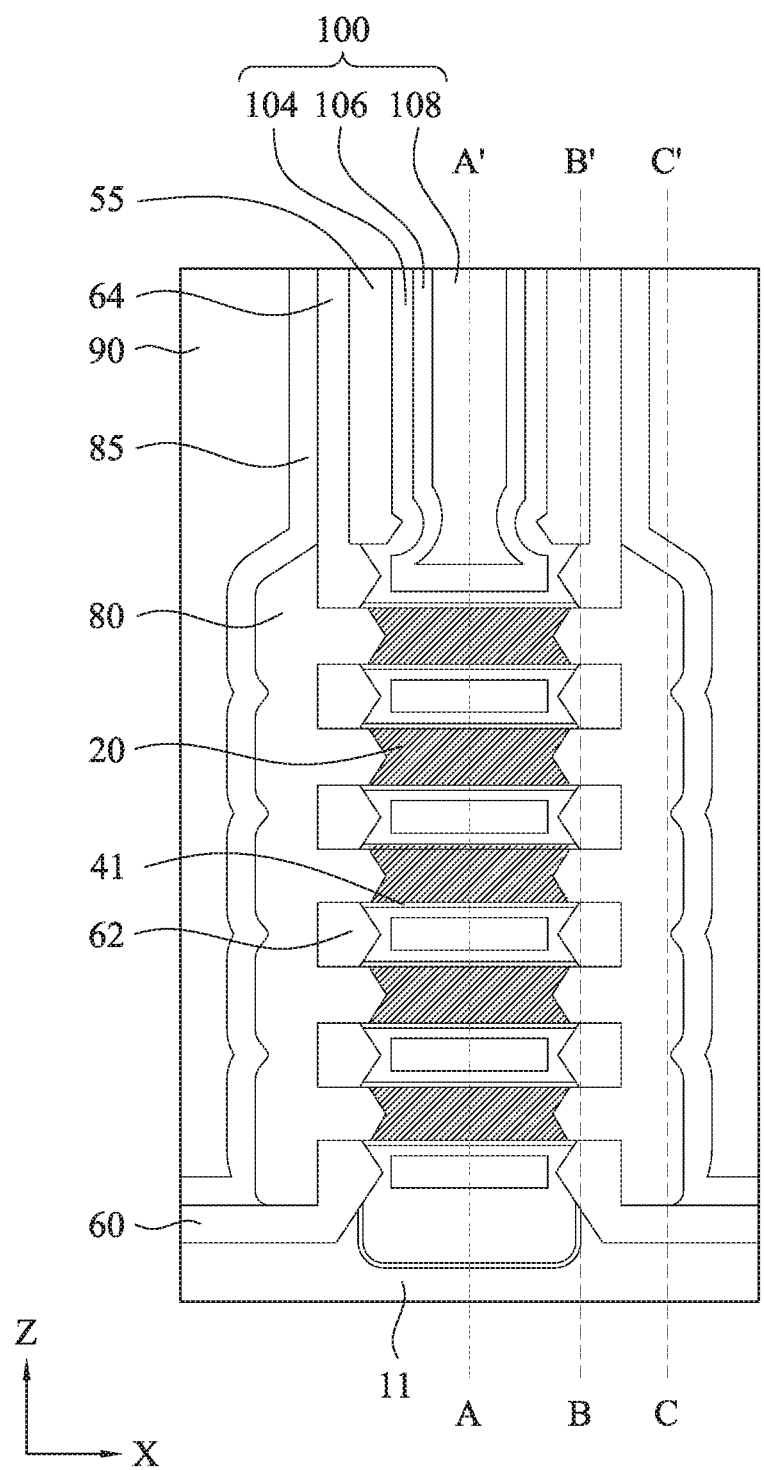
FIGS. 2A, 2B, 2C and 2D show various views of a GAA FET device according to another embodiment of the present disclosure.
Figure 2D:
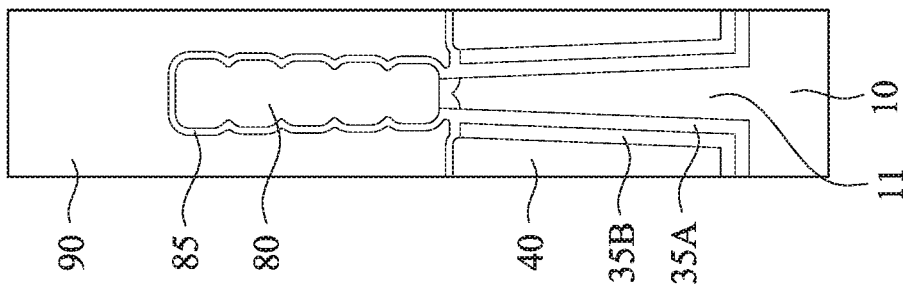
Figure 2C:
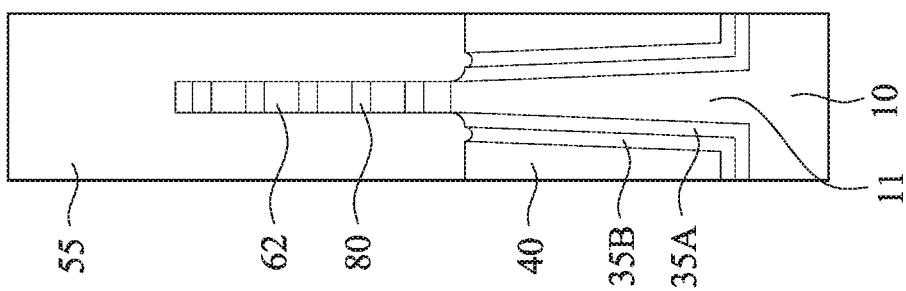
Figure 2B:
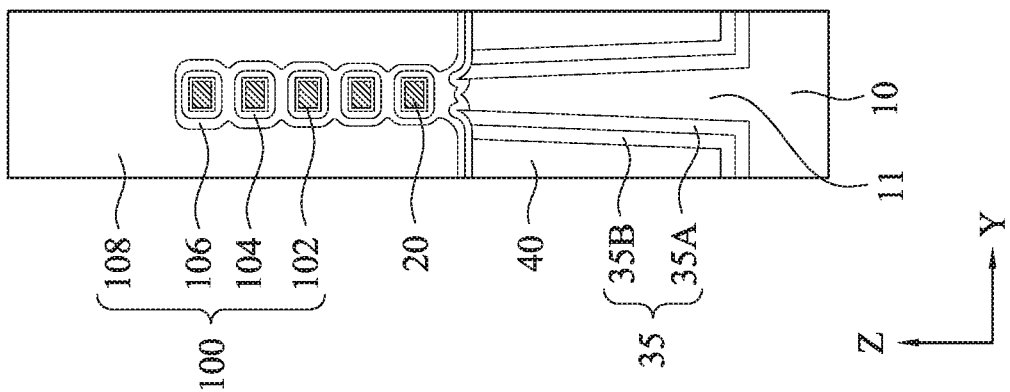

FIG. 2A-2D show various views of a GAA FET device according to another embodiment of the present disclosure. FIG. 2A shows a cross sectional view along the X direction, in which a fin structure and channels (nanowires) extend. FIGS. 2B, 2C and 2D shows cross sectional views along the Y direction, in which a gate electrode extend. FIG. 2B is the cross sectional view corresponding to line A-A' of FIG. 2A cutting the center of channels. FIG. 2C is the cross sectional view corresponding to line B-B' of FIG. 2A cutting the center of a first gate sidewall spacer. FIG. 2D is the cross sectional view corresponding to line C-C' of FIG. 2A cutting a source/drain epitaxial layer. In some embodiments, the GAA FET is n-channel FET.

As shown in FIGS. 2A-2D, a bottom fin structure 11 is disposed over a substrate 10. A plurality of semiconductor wires 20, as channels, are vertically arranged over the bottom fin structure 11. Although five semiconductor wires 20 are shown in FIGS. 2A and 2B, the number of vertically arranged semiconductor wires 20 is not limited to five, and it can be as small as one and up to 15-20. In some embodiments, the semiconductor wires 20 are made of $Si_{1-x}Ge_x$, where x is equal to or more than about 0.5, or Ge (x=1.0). In some embodiments, one or more fin liner layers 35 are disposed on side faces of the bottom fin structure 11. In certain embodiments, the fin liner layers 35 include a first fin liner layer 35A disposed in contact with the bottom fin structure 11 and a second fin liner layer 35B made of a different material than the first fin liner layer 35A and disposed over the first fin liner layer 35A. In some embodiments, at least the uppermost portion of the bottom fin structure 11 includes a layer made of SiGe.

A gate structure 100 includes a gate dielectric layer 104 wrapping around the semiconductor wires 20 and a gate electrode layer 108 disposed over the gate dielectric layer 104. In some embodiments, an interfacial layer 102 is disposed between the gate dielectric layer 104 and the semiconductor wires 20. In some embodiments, one or more work function adjustment layers 106 are disposed between the gate electrode layer 108 and the gate dielectric layer 104. In some embodiments, the gate electrode layer 108 is not disposed between the semiconductor nanowires 20 and the work function adjustment layer 106 fill gaps between adjacent semiconductor wires 20. In other embodiments, the gate electrode layer 108 wraps around the semiconductor wires, as well as the interfacial layer 102, the gate dielectric layer 104 and the work function adjustment layer 106. Further, as shown in FIGS. 2A and 2C, first gate sidewall spacers 55 are disposed opposing side faces of the gate structure 100.

Further, a source/drain epitaxial layer 80 is disposed to be connected to horizontal ends of the semiconductor wires 20. As shown in FIG. 2A, the horizontal ends of the semiconductor wires 20 has a concave V-shape or U-Shape. A liner layer 85, which may be a contact etch stop layer (CESL), is disposed over the source/drain epitaxial layer 80, and an interlayer dielectric (ILD) layer 90 is disposed over the liner layer 85. In some embodiments, the source/drain epitaxial layer 80 is made of a semiconductor material having a higher energy band gap than the semiconductor material of the semiconductor wires 20. In certain embodiments, the source/drain epitaxial layer 80 is made of Si doped with P (SiP).

The GAA FET shown in FIGS. 2A-2D further includes dielectric inner spacers 62 disposed between the gate structure 100 disposed between adjacent semiconductor wires 20 and the source/drain epitaxial layer 80. Further, a dielectric layer 60 made of the same material as the dielectric inner spacers 62 is disposed between the source/drain epitaxial layer 80 and the bottom fin structure 11. In addition, second side wall spacers 64 made of the same material as the dielectric inner spacers 62 are disposed between the first gate sidewall spacers 55 and the liner layer 85 as shown in FIG. 2A.

In some embodiments, as shown in FIG. 2A, the interface between at least one of the semiconductor wires 20 and the source/drain epitaxial layer 80 is located under one of the first gate sidewall spacers 55. In certain embodiments, the location under one of the first gate sidewall spacers 55 corresponds to a cross section (Y-Z plane) cutting the center of the first gate sidewall spacer 55 in the X direction. In some embodiments, the interface is located closer to the gate structure 100 than the center line (line B-B' of FIG. 2A) of the first gate sidewall spacer 55. In some embodiments, an entirety of the dielectric inner spacers 62 is located under the first gate sidewall spacers 55. In other embodiments, the interface between at least one of the dielectric inner spacers 62 and the source/drain epitaxial layers 80 is located outside a region under one of the first sidewall spacers 55.

In some embodiments, the first gate sidewall spacers 55 are not in contact with the semiconductor wires 20. In certain embodiments, the second gate sidewall spacers 64 are not in contact with the semiconductor wires 20.

FIGS. 3-21B show a sequential process for manufacturing a GAA FET device shown in FIGS. 1A-1D according to an embodiment of the present disclosure. It is understood that additional operations can be provided before, during, and after processes shown by FIGS. 3-21B, and some of the operations described below can be replaced or eliminated, for additional embodiments of the method. The order of the operations/processes may be interchangeable.

Figure 3:
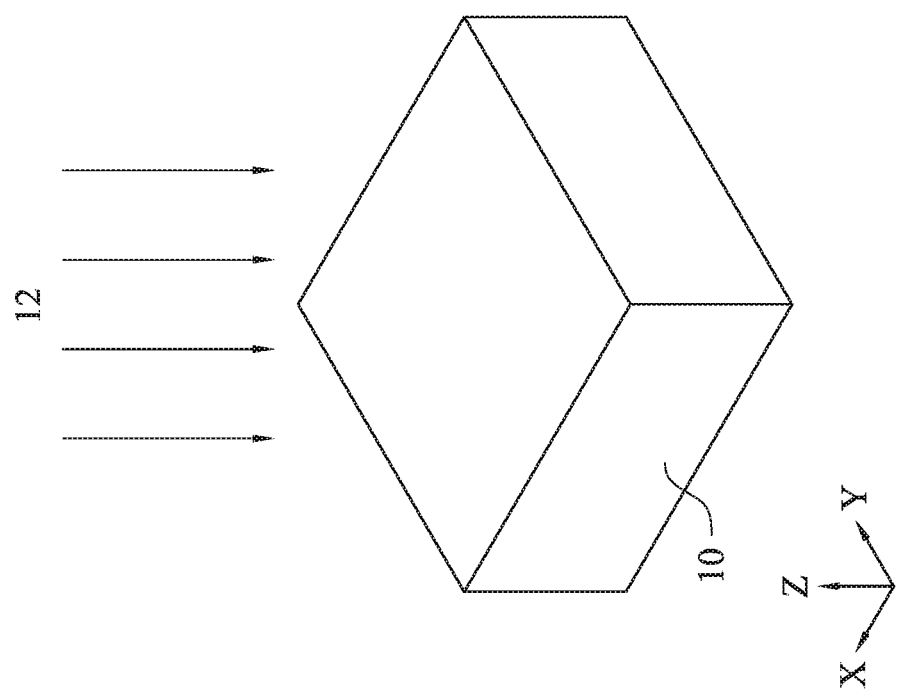
FIG. 3 shows a view of one of the various stages of a sequential manufacturing process for a GAA FET device according to an embodiment of the present disclosure.

As shown in FIG. 3, impurity ions (dopants) 12 are implanted into a silicon substrate 10 to form a well region. The ion implantation is performed to prevent a punch-through effect. In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 4:
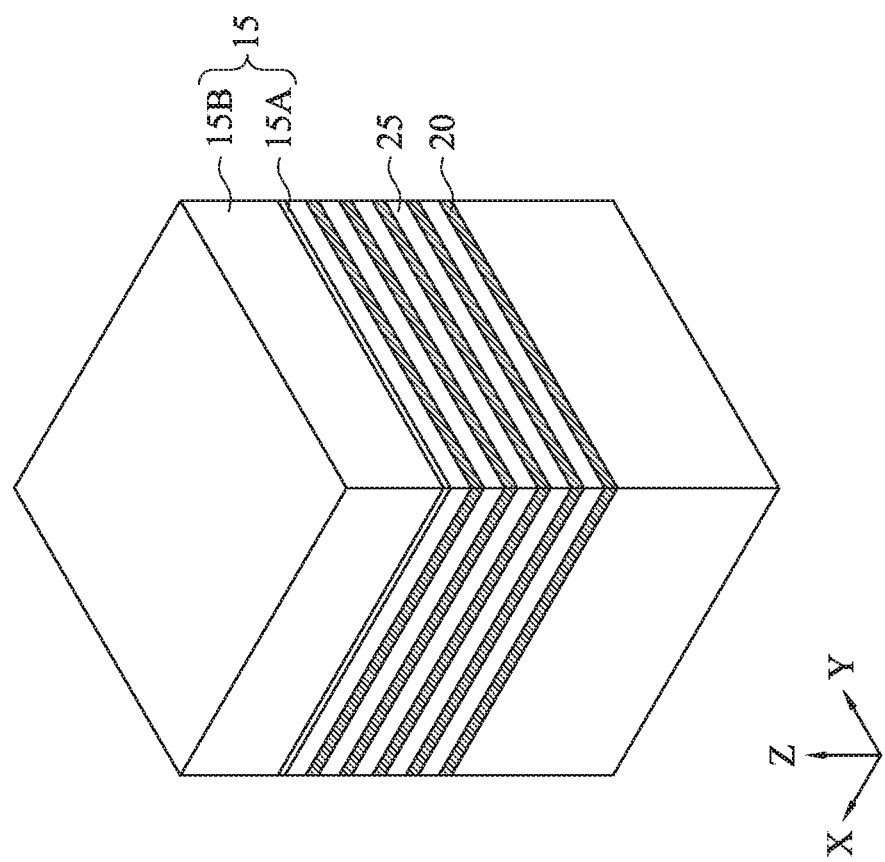
FIG. 4 shows a view of one of the various stages of a sequential manufacturing process for a GAA FET device according to an embodiment of the present disclosure.

As shown in FIG. 4, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.5, or Ge (x=1.0) and the second semiconductor layers 25 are Si or $Si_{1-y}Ge_y$, where y is equal to or less than about 0.6, and x>y. In this disclosure, an "M" compound" or an "M based compound" means the majority of the compound is M.

In FIG. 4, five layers of the first semiconductor layer 20 and five layers of the second semiconductor layer 25 are disposed. However, the number of the layers are not limited to five, and may be as small as 1 (each layer) and in some embodiments, 2-20 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 5:
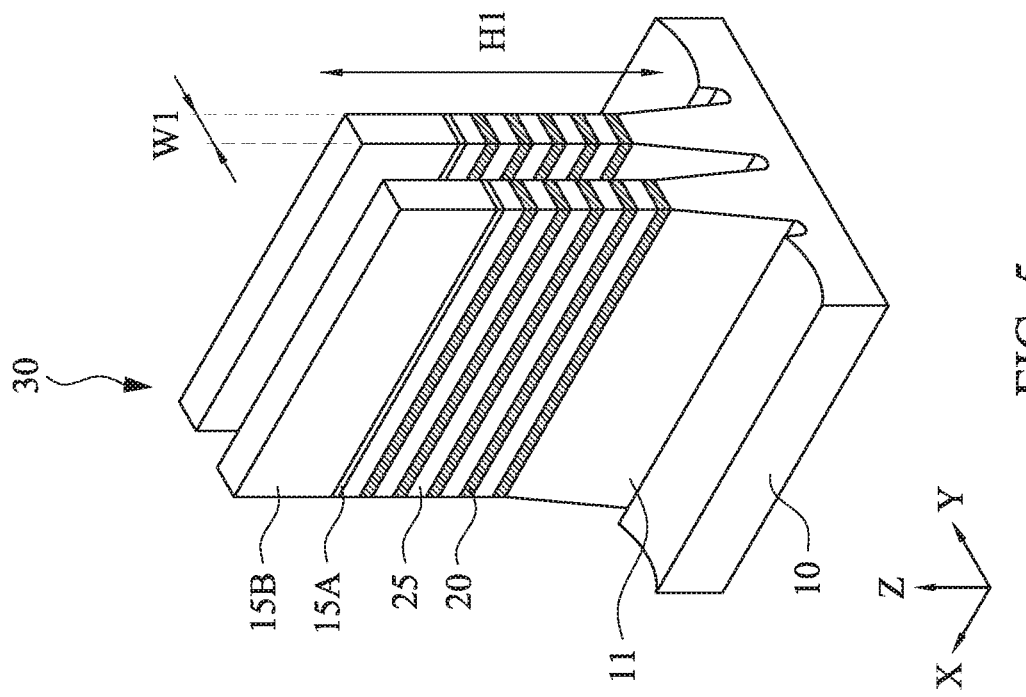
FIG. 5 shows a view of one of the various stages of a sequential manufacturing process for a GAA FET device according to an embodiment of the present disclosure.

Next, as shown in FIG. 5, the stacked layers of the first and second semiconductor layers 20, 25 are patterned by using the patterned mask layer, thereby the stacked layers are formed into fin structures 30 extending in the X direction.

The fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

In FIG. 5, two fin structures 30 are arranged in the Y direction. But the number of the fin structures is not limited to, and may be as small as one and as large as three or more. In some embodiments, one or more dummy fin structures are formed on both sides of the fin structures 30 to improve pattern fidelity in the patterning operations. As shown in FIG. 5, the fin structures 30 have upper portions constituted by the stacked semiconductor layers 20, 25 and well portions 11, which corresponds to the bottom fin structure.

The width W1 of the upper portion of the fin structure 30 along the Y direction is in a range from about 10 nm to about 40 nm in some embodiments, and is in a range from about 20 nm to about 30 nm in other embodiments. The height H1 along the Z direction of the fin structure 30 is in a range from about 100 nm to about 200 nm.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 6.

Figure 6:
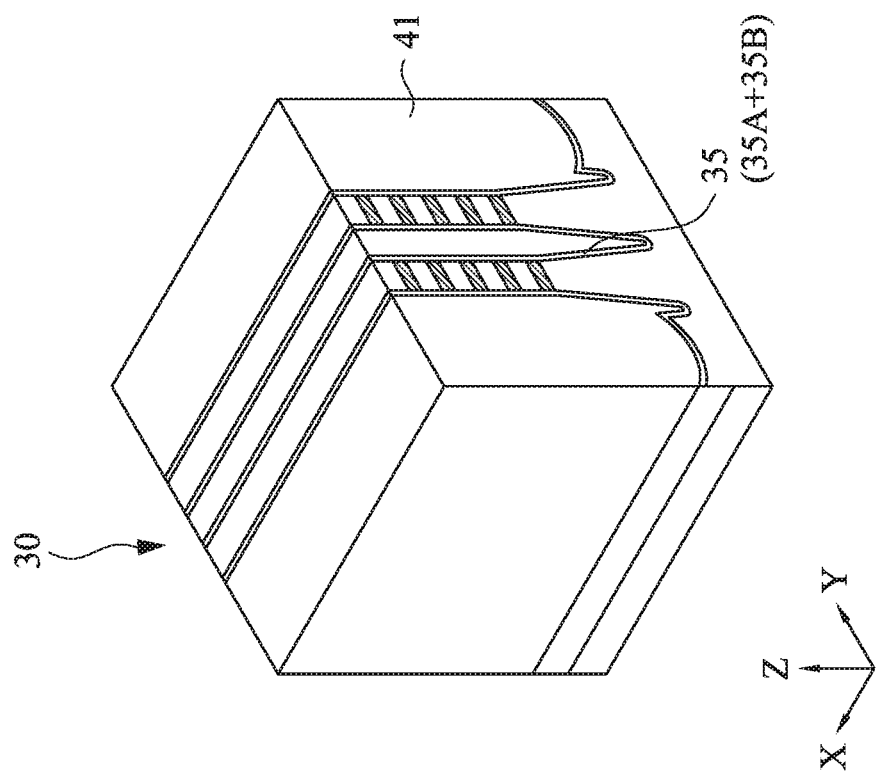
FIG. 6 shows a view of one of the various stages of a sequential manufacturing process for a GAA FET device according to an embodiment of the present disclosure.

In some embodiments, one or more fin liner layers 35 are formed over the structure of FIG. 5 before forming the insulating material layer 41, as shown FIG. 6. The liner layer 35 is made of SiN or a silicon nitride-based material (e.g., SiON, SiCN or SiOCN). In some embodiments, the fin liner layers 35 include a first fin liner layer 35A formed over the substrate 10 and side faces of the bottom fin structures 11, and a second fin liner layer 35B formed on the first fin liner layer 35A. Each of the liner layers has a thickness between about 1 nm and about 20 nm in some embodiments. In some embodiments, the first fin liner layer 35A includes silicon oxide and has a thickness between about 0.5 nm and about 5 nm, and the second fin liner layer 35B includes silicon nitride and has a thickness between about 0.5 nm and about 5 nm. The fin liner layers 35 may be deposited through one or more processes such as physical vapor deposition (PVD), chemical vapor deposition (CVD), or atomic layer deposition (ALD), although any acceptable process may be utilized.

Figure 7:
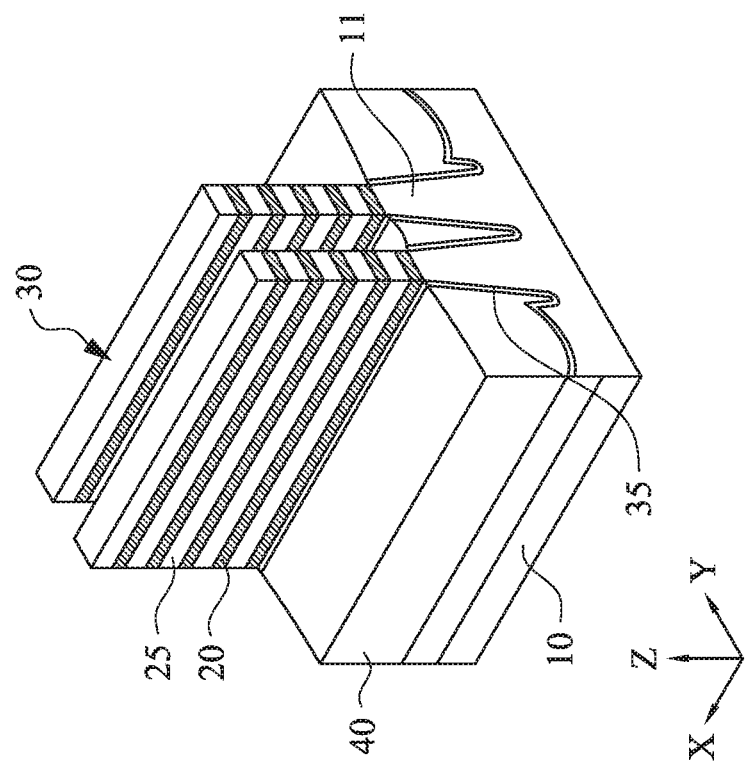
FIG. 7 shows a view of one of the various stages of a sequential manufacturing process for a GAA FET device according to an embodiment of the present disclosure.

Then, as shown in FIG. 7, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI). In the embodiment shown in FIG. 7, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 8:
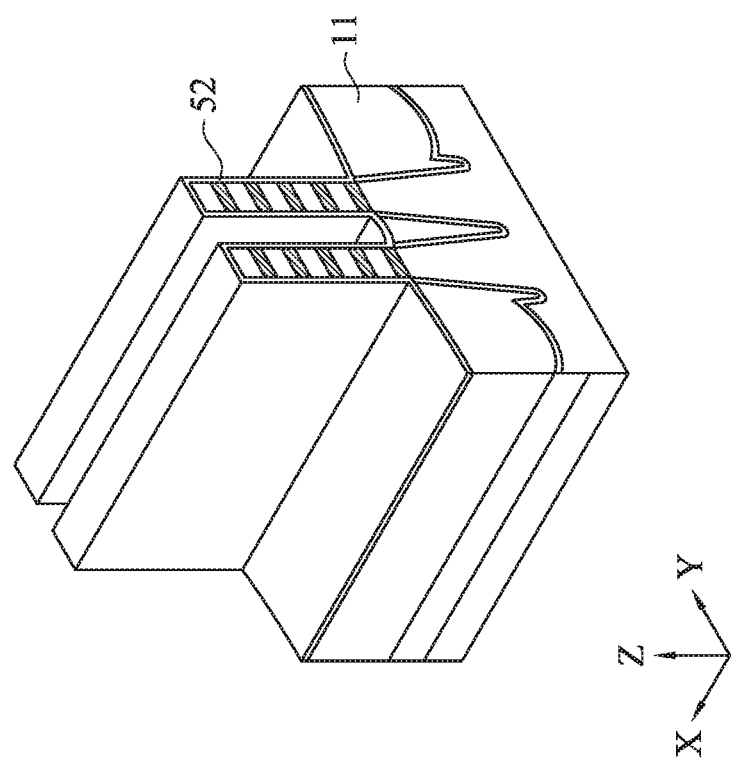
FIG. 8 shows a view of one of the various stages of a sequential manufacturing process for a GAA FET device according to an embodiment of the present disclosure.

After the isolation insulating layer 40 is formed, a sacrificial gate dielectric layer 52 is formed, as shown in FIG. 8. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 9:
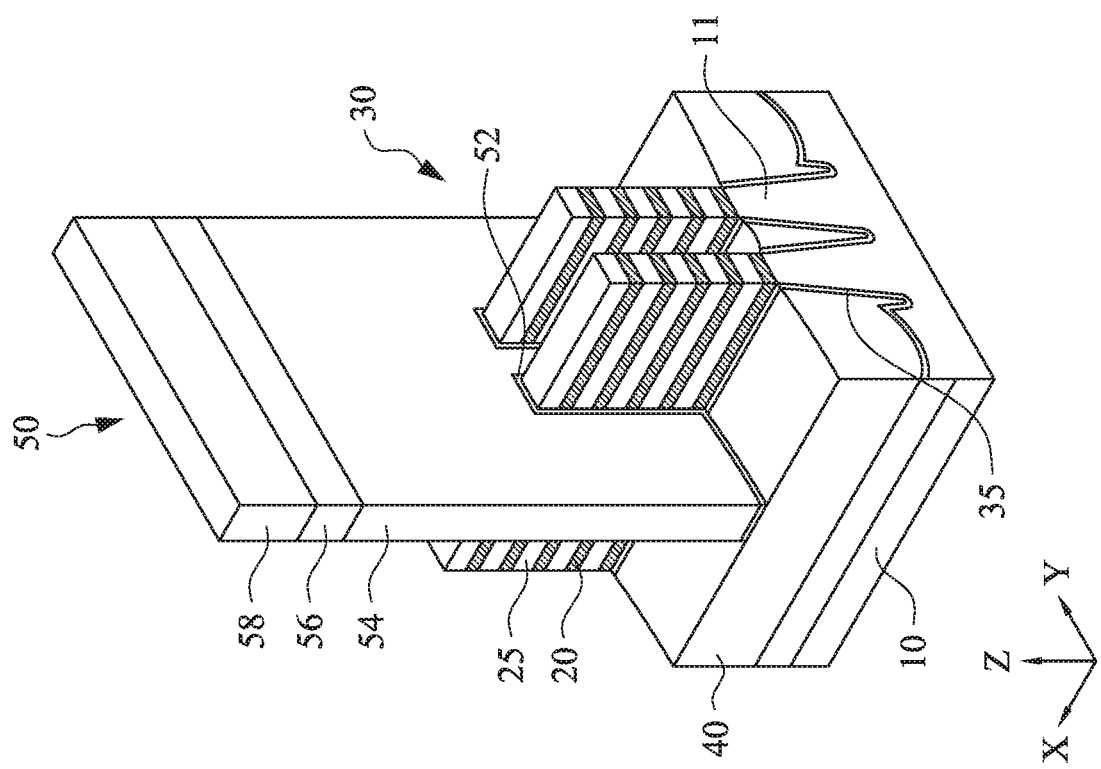
FIG. 9 shows a view of one of the various stages of a sequential manufacturing process for a GAA FET device according to an embodiment of the present disclosure.

FIG. 9 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure 50 defines the channel region of the GAA FET.

The sacrificial gate structure 50 is formed by first blanket depositing the sacrificial gate dielectric layer 52 over the fin structures 30, as shown in FIG. 9. A sacrificial gate electrode layer is then blanket deposited on the sacrificial gate dielectric layer and over the fin structures 30, such that the fin structures 30 are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 9. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 9. In this disclosure, a source and a drain are interchangeably used and the structures thereof are substantially the same. In FIG. 9, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 10:
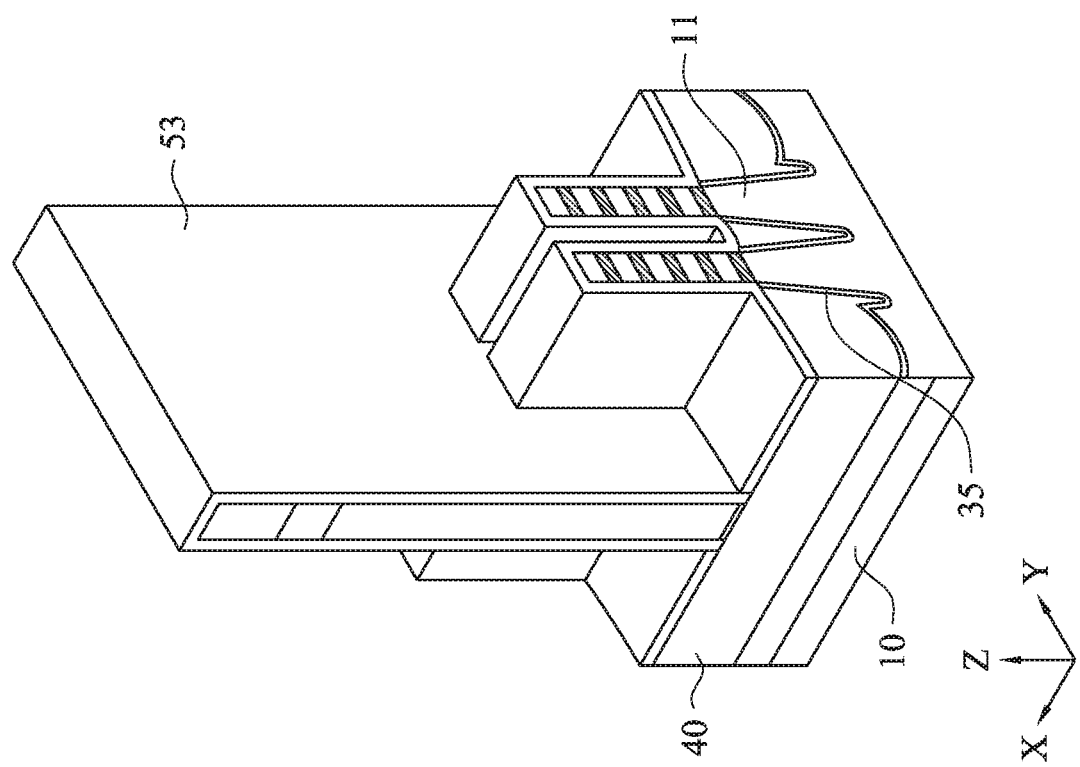
FIG. 10 shows a view of one of the various stages of a sequential manufacturing process for a GAA FET device according to an embodiment of the present disclosure.

After the sacrificial gate structure is formed, a blanket layer 53 of an insulating material for gate sidewall spacers 55 is conformally formed by using CVD or other suitable methods, as shown in FIG. 10. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In some embodiments, the insulating material of the blanket layer 53 is a silicon nitride-based material, such as SiN, SiON, SiOCN or SiCN and combinations thereof. In certain embodiments, the insulating material is one of SiOC, SiCON and SiCN.

Figure 11B:
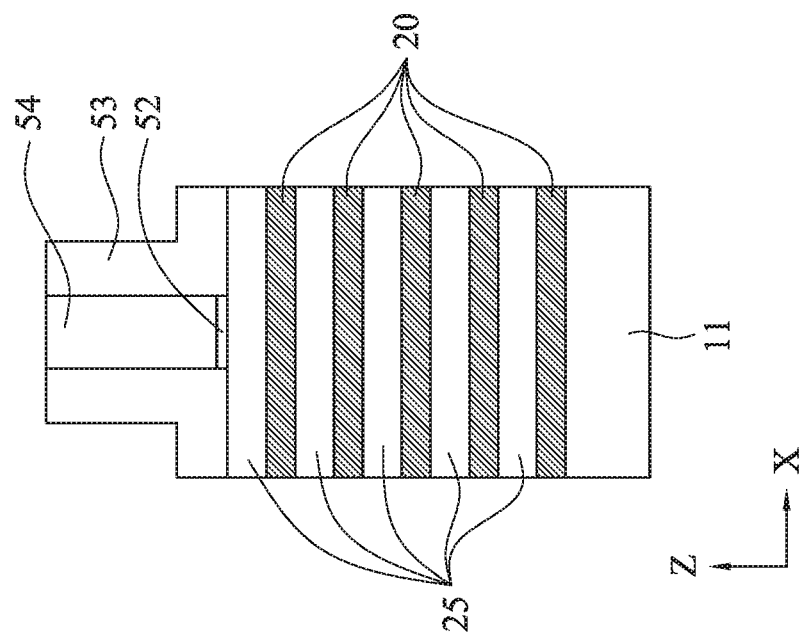
FIGS. 11A and 11B show views of one of the various stages of a sequential manufacturing process for a GAA FET device according to an embodiment of the present disclosure.
Figure 11A:
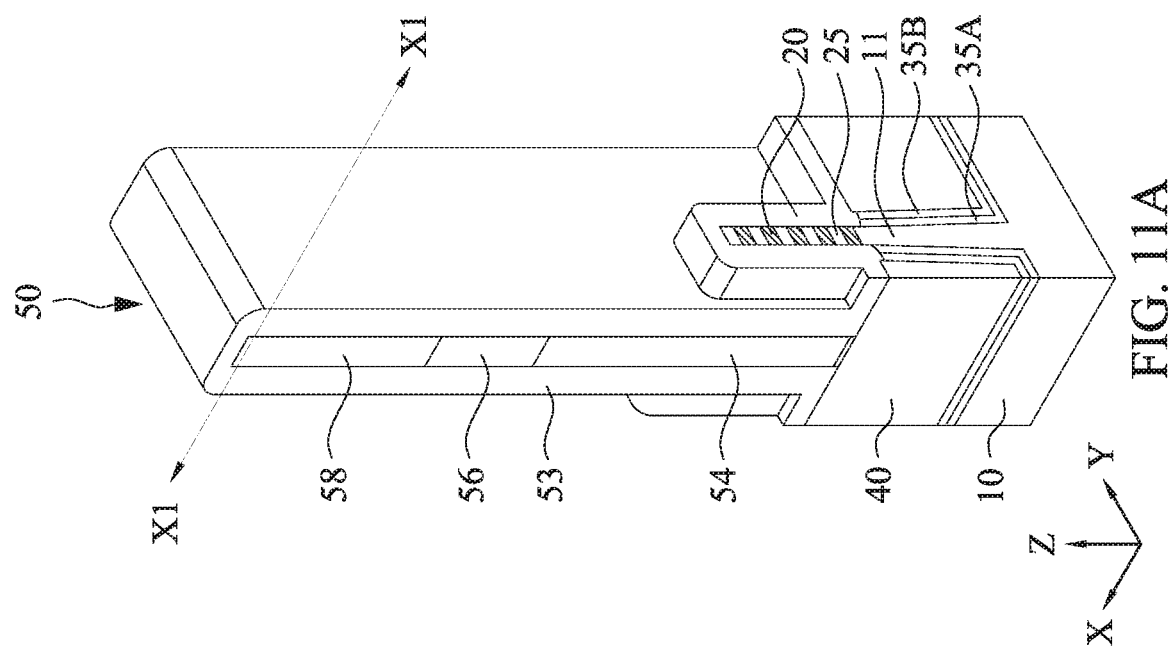

FIGS. 11A and 11B show the same structure as FIG. 10. FIG. 11A shows a perspective view and FIG. 11B shows a cross sectional view corresponding to line X1-X1 of FIG. 11A cutting the fin structure 30. In FIG. 11B the pad SiN layer 56 and the silicon oxide mask layer 58 are not shown.

Figure 12B:
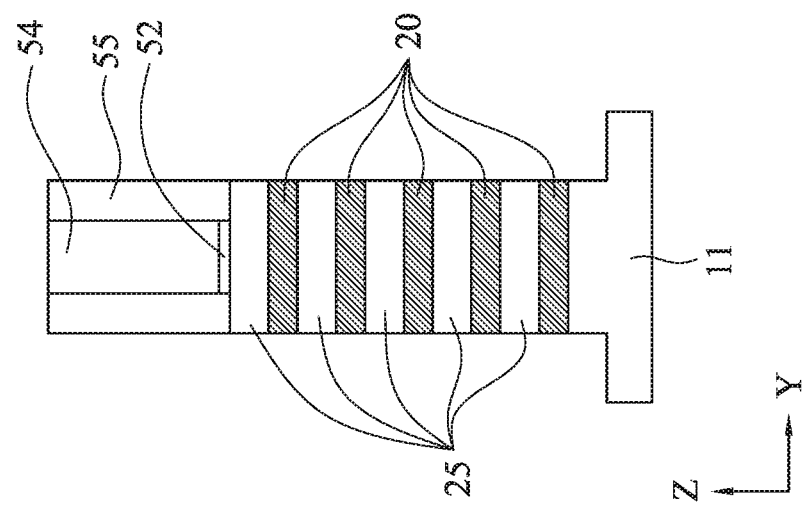
FIGS. 12A and 12B show views of one of the various stages of a sequential manufacturing process for a GAA FET device according to an embodiment of the present disclosure.
Figure 12A:
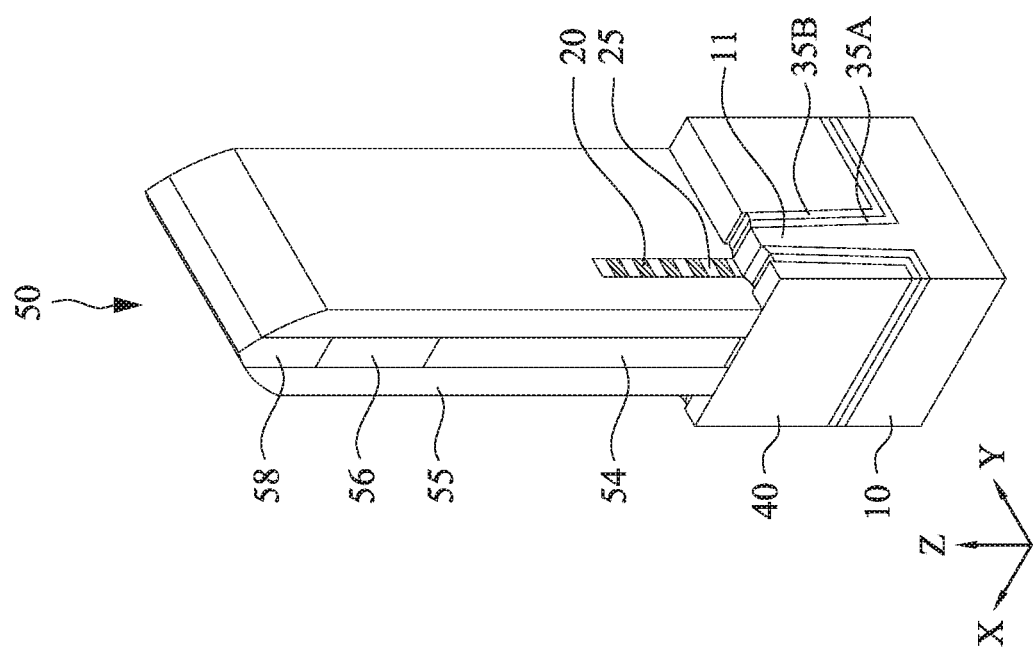

Further, as shown in FIGS. 12A and 12B, the gate sidewall spacers 55 are formed on opposite sidewalls of the sacrificial gate structures by anisotropic etching, and subsequently, the S/D regions of the fin structure are recessed equal to or down below the upper surface of the isolation insulating layer 40. FIG. 12A shows a perspective view and FIG. 12B shows a cross sectional view corresponding to line X1-X1 of FIG. 11A. In FIG. 12B the pad SiN layer 56 and the silicon oxide mask layer 58 are not shown.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, an isotropic etching process may be subsequently performed to remove the insulating material from the upper portions of the S/D region of the exposed fin structures 30.

Subsequently, the S/D regions of the fin structure are recessed down equal to or below the upper surface of the isolation insulating layer 40, by using dry etching and/or wet etching. As shown in FIGS. 12A and 12B, the sidewall spacers 55 formed on the S/D regions of the exposed fin structures are also removed. At this stage, end portions of the stacked layer of the first and second semiconductor layers 20, 25 under the sacrificial gate structure have substantially flat faces which are flush with the sidewall spacers 55, as shown in FIG. 12B. In some embodiments, the end portions of the stacked layer of the first and second semiconductor layers 20, 25 are slightly horizontally etched.

Figure 13B:
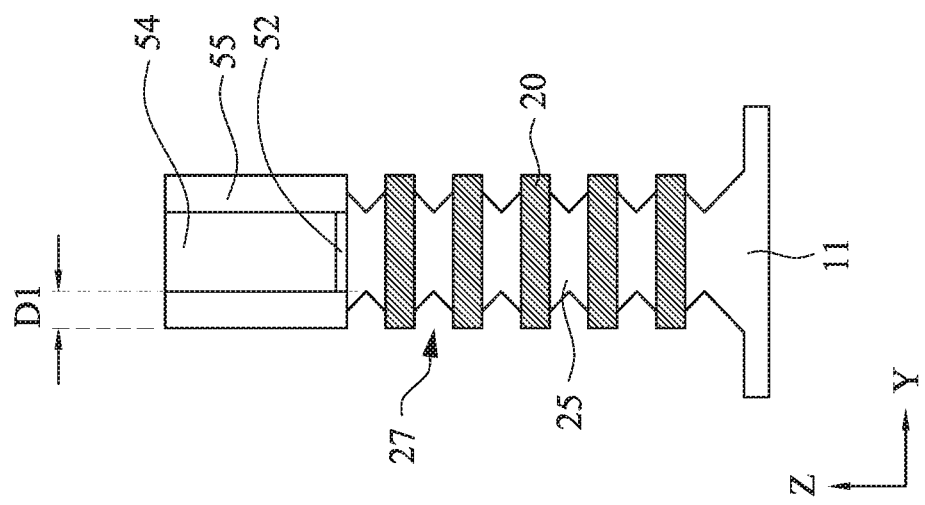
FIGS. 13A and 13B show views of one of the various stages of a sequential manufacturing process for a GAA FET device according to an embodiment of the present disclosure.
Figure 13A:
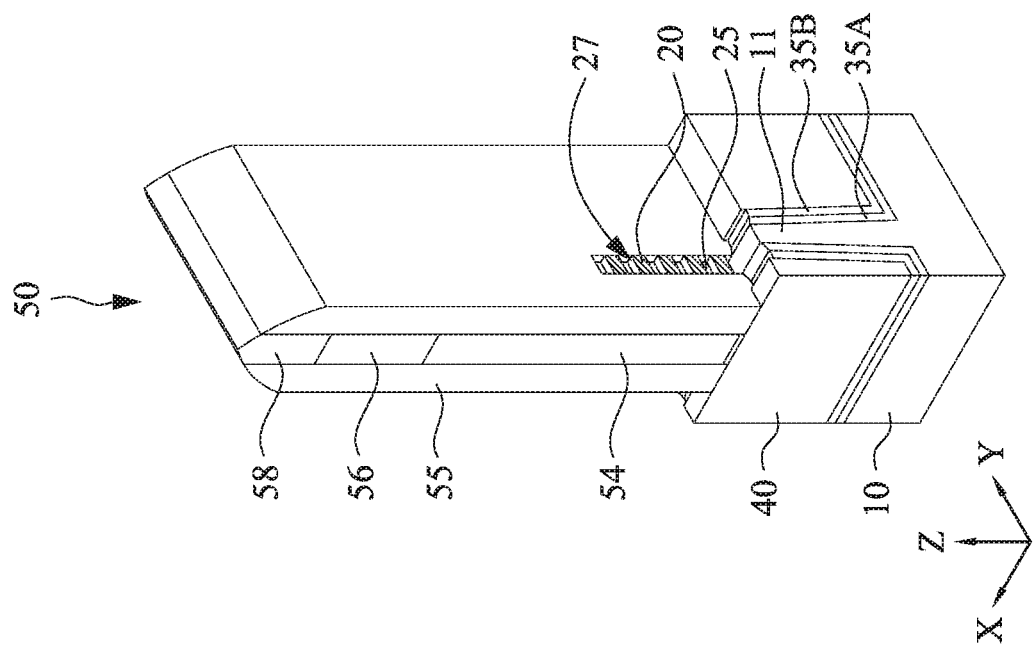

Subsequently, as shown in FIGS. 13A and 13B, the second semiconductor layers 25 are horizontally recessed (etched) so that edges of the second semiconductor layers 25 are located substantially below the gate sidewall spacers 55 and cavities 27 are formed. FIG. 13A shows a perspective view and FIG. 13B shows a cross sectional view corresponding to line X1-X1 of FIG. 11A cutting the fin structure 30. In FIG. 13B the pad SiN layer 56 and the silicon oxide mask layer 58 are not shown. As shown in FIG. 13B, end portions (edges) of the second semiconductor layers 25 have a concave shape such as a V-shape or a U-shape. The depth D1 of the recessing of the second semiconductor layers 25 from the plane including one gate sidewall spacer 55 is in a range from about 5 nm to about 10 nm. The etching of the first semiconductor layer 25 includes wet etching and/or dry etching. A wet etchant such as a tetramethylammonium hydroxide (TMAH) solution can be used to selectively etch the second semiconductor layers 25.

Then, as shown in FIGS. 14A and 14B, a dielectric material layer 60 is formed over the structure of FIGS. 13A and 13B. FIG. 14A shows a perspective view and FIG. 14B shows a cross sectional view corresponding to line X1-X1 of FIG. 11A cutting the fin structure 30. In FIG. 14B the pad SiN layer 56 and the silicon oxide mask layer 58 are not shown. In some embodiments, the dielectric material layer 60 includes a silicon nitride-based material, such as SiN, SiON, SiOCN or SiCN and combinations thereof and is different from the material of the gate sidewall spacers 55. In certain embodiments, the dielectric material is silicon nitride. The dielectric material layer 60 fully fills the cavities 27 as shown in FIG. 14B. The dielectric material layer 60 can be formed using CVD, including LPCVD and PECVD, PVD, ALD, or other suitable processes.

Next, as shown in FIGS. 15A and 15B, one or more etching operations are performed to form dielectric inner spacers 62. FIG. 15A shows a perspective view and FIG. 15B shows a cross sectional view corresponding to line X1-X1 of FIG. 11A cutting the fin structure 30. In FIG. 15B the pad SiN layer 56 and the silicon oxide mask layer 58 are not shown. The etching operations include one or more wet and/or dry etching operations. In certain embodiments, the etching is an isotropic etching in some embodiments. The maximum thickness along the Y direction of the dielectric inner spacers 62 is in a range from about 0.5 nm to about 5 nm in some embodiments. As shown in FIGS. 15A and 15B, a part of the dielectric material layer 60 remains over the bottom fin structure 11, while the dielectric material layer 60 formed on the gate sidewall spacers 55 and the isolation insulating layer 40 is removed.

Figure 16B:
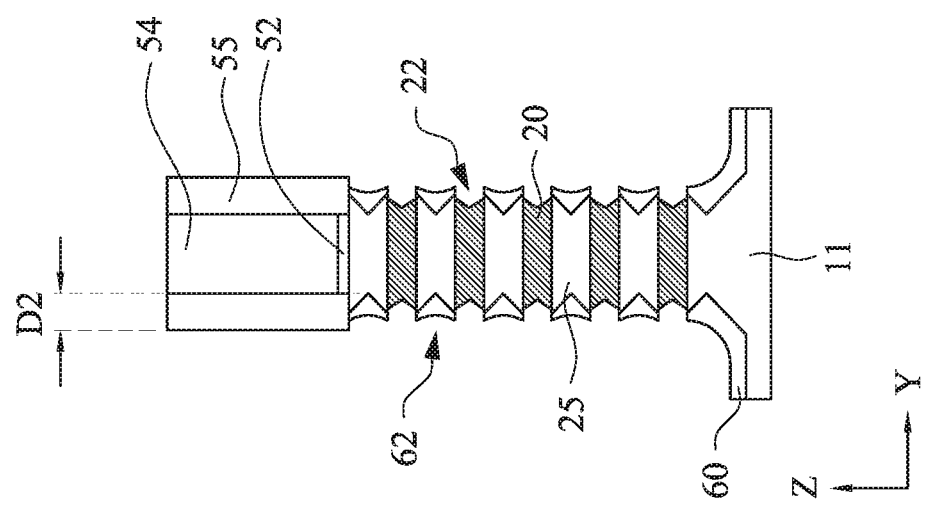
FIGS. 16A and 16B show views of one of the various stages of a sequential manufacturing process for a GAA FET device according to an embodiment of the present disclosure.
Figure 16A:
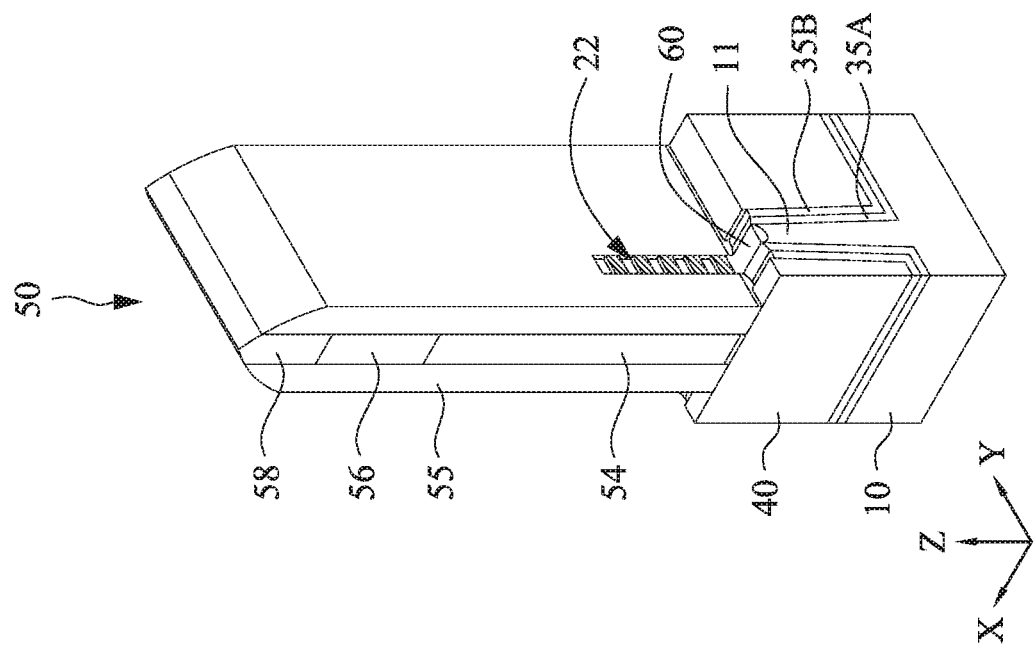

Subsequently, as shown in FIGS. 16A and 16B, the first semiconductor layers 20 are horizontally recessed (etched) so that edges of the first semiconductor layers 20 are located substantially below the gate sidewall spacers 55 and cavities 22 are formed. FIG. 16A shows a perspective view and FIG. 16B shows a cross sectional view corresponding to line X1-X1 of FIG. 11A. In FIG. 16B the pad SiN layer 56 and the silicon oxide mask layer 58 are not shown. As shown in FIG. 16B, end portions (edges) of the first semiconductor layers 20 have a concave shape such as a V-shape or a U-shape. The depth D2 of the recessing of the first semiconductor layers 20 from the plane including a surface of one gate sidewall spacer 55 is in a range from about 7 nm to about 15 nm. The etching of the first semiconductor layer 25 includes wet etching and/or dry etching. A wet etchant such as an ammonium hydroxide (NH$_4$OH), tetramethylammonium solution can be used to selectively etch the first semiconductor layers 20. In some embodiments, D2 is greater than D1. As shown in FIG. 16A, the first semiconductor layers 20 are separated from the gate sidewall spacers 55 and the dielectric inner spacers 62 by this etching.

After the cavities 22 are formed, source/drain (S/D) epitaxial layers 80 are formed, as shown in FIGS. 17A and 17B. FIG. 17A shows a perspective view and FIG. 17B shows a cross sectional view corresponding to line X1-X1 of FIG. 11A. In FIG. 17B the pad SiN layer 56 and the silicon oxide mask layer 58 are not shown. The S/D epitaxial layer 80 includes one or more layers of Si, SiP, SiC and SiCP for an n-channel FET. The S/D epitaxial layers 80 are formed by an epitaxial growth method using CVD, ALD or molecular beam epitaxy (MBE). As shown in FIG. 17B, the interface between at least one of the first semiconductor layers 20 and the S/D epitaxial layer 80 is located under one of the gate sidewall spacers 55.

Figure 18B:
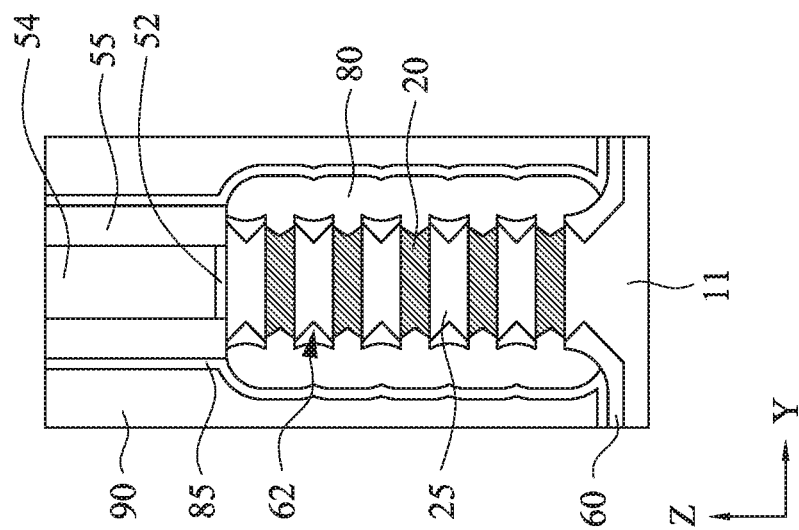
FIGS. 18A and 18B show views of one of the various stages of a sequential manufacturing process for a GAA FET device according to an embodiment of the present disclosure.
Figure 18A:
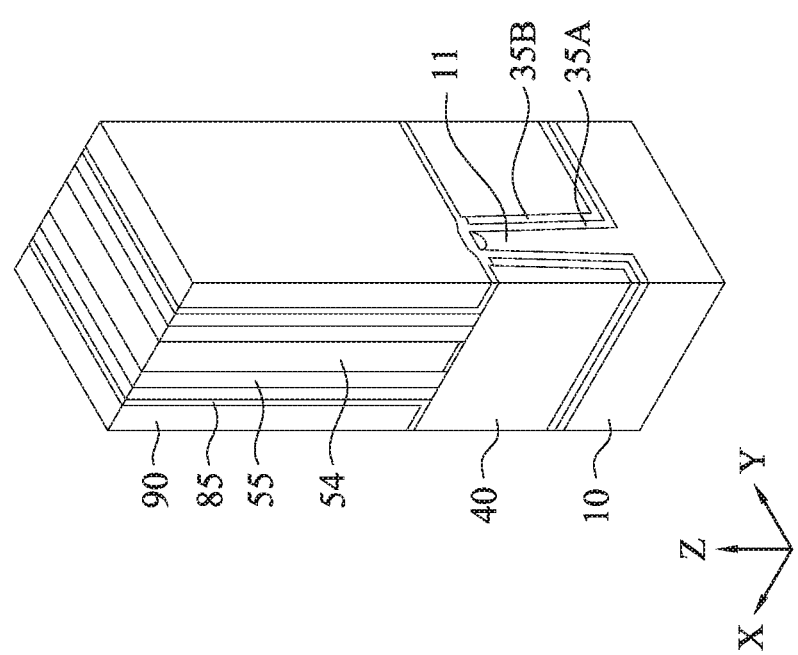

Subsequently, a liner layer 85 is formed and then an interlayer dielectric (ILD) layer 90 is formed, as shown in FIGS. 18A and 18B. FIG. 18A shows a perspective view and FIG. 18B shows a cross sectional view corresponding to line X1-X1 of FIG. 11A.

The liner layer 85 is made of a silicon nitride-based material, such as silicon nitride, and functions as a contact etch stop layer (CESL) in the subsequent etching operations. The materials for the ILD layer 90 include compounds comprising Si, O, C and/or H, such as silicon oxide, SiCOH and SiOC. Organic materials, such as polymers, may be used for the ILD layer 90. After the ILD layer 90 is formed, a planarization operation, such as CMP, is performed, so that the sacrificial gate electrode layer 54 is exposed, as shown in FIGS. 18A and 18B.

Figure 19B:
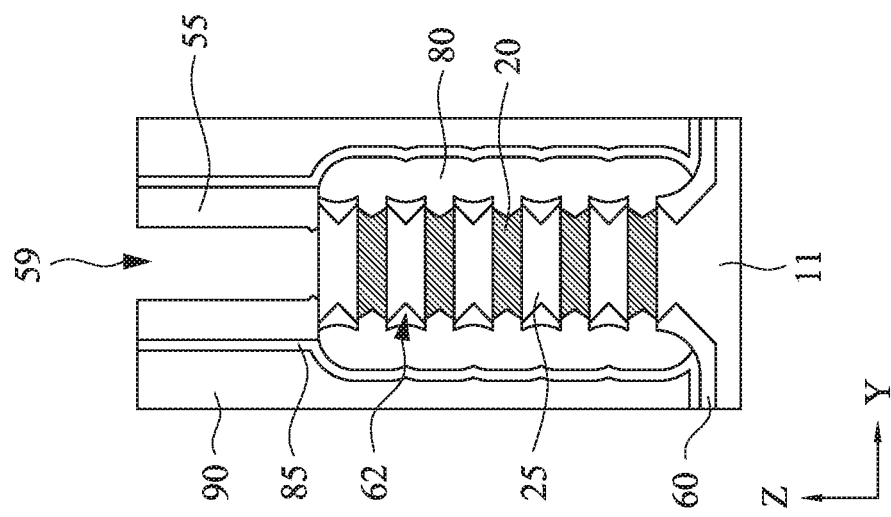
FIGS. 19A and 19B show views of one of the various stages of a sequential manufacturing process for a GAA FET device according to an embodiment of the present disclosure.
Figure 19A:
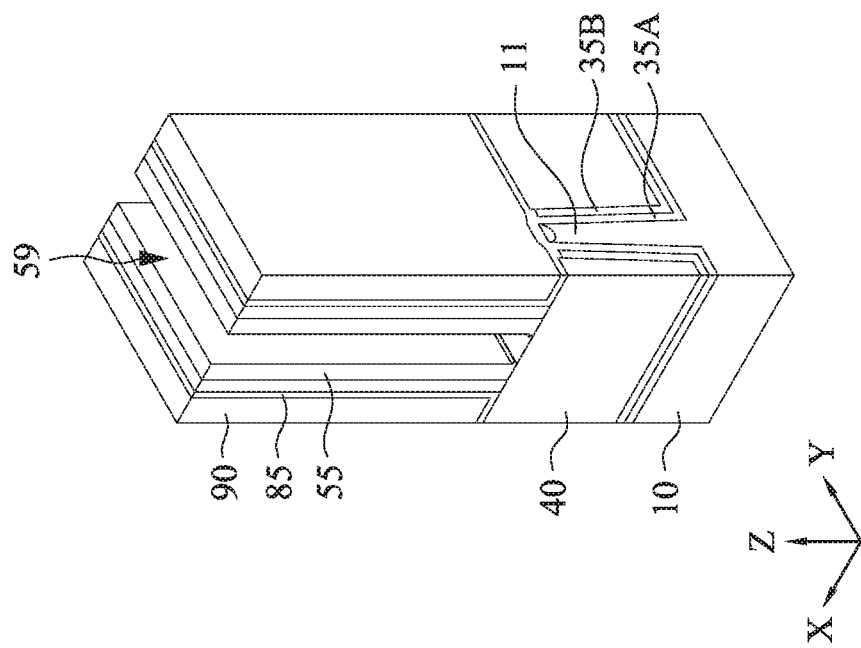

Next, as shown in FIGS. 19A and 19B, the sacrificial gate electrode layer 54 and sacrificial gate dielectric layer 52 are removed, thereby exposing a channel region of the fin structures in a space 59. FIG. 19A shows a perspective view and FIG. 19B shows a cross sectional view corresponding to line X1-X1 of FIG. 11A. The ILD layer 90 protects the S/D epitaxial layers 80 during the removal of the sacrificial gate structures. The sacrificial gate structures can be removed using plasma dry etching and/or wet etching. When the sacrificial gate electrode layer 54 is polysilicon and the ILD layer 90 is silicon oxide, a wet etchant such as a TMAH solution can be used to selectively remove the sacrificial gate electrode layer 54. (Original) The sacrificial gate dielectric layer 52 is thereafter removed using plasma dry etching and/or wet etching.

Figure 20B:
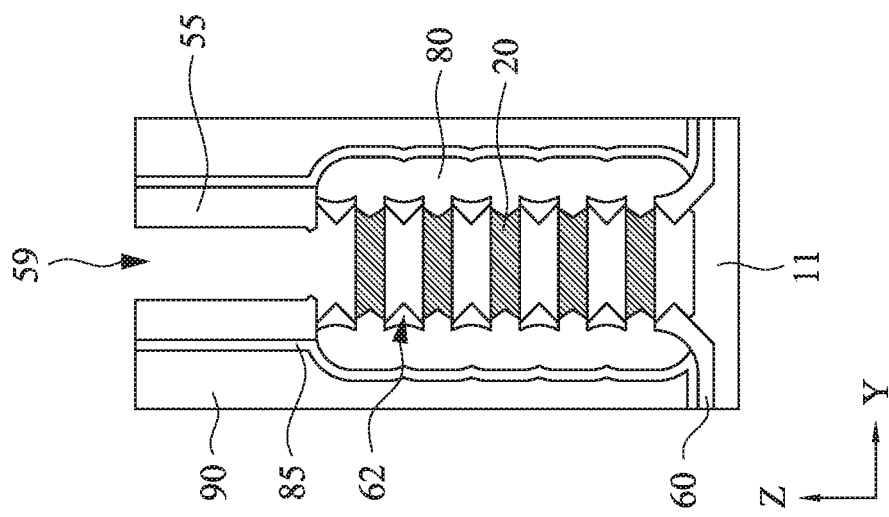
FIGS. 20A and 20B show views of one of the various stages of a sequential manufacturing process for a GAA FET device according to an embodiment of the present disclosure.
Figure 20A:
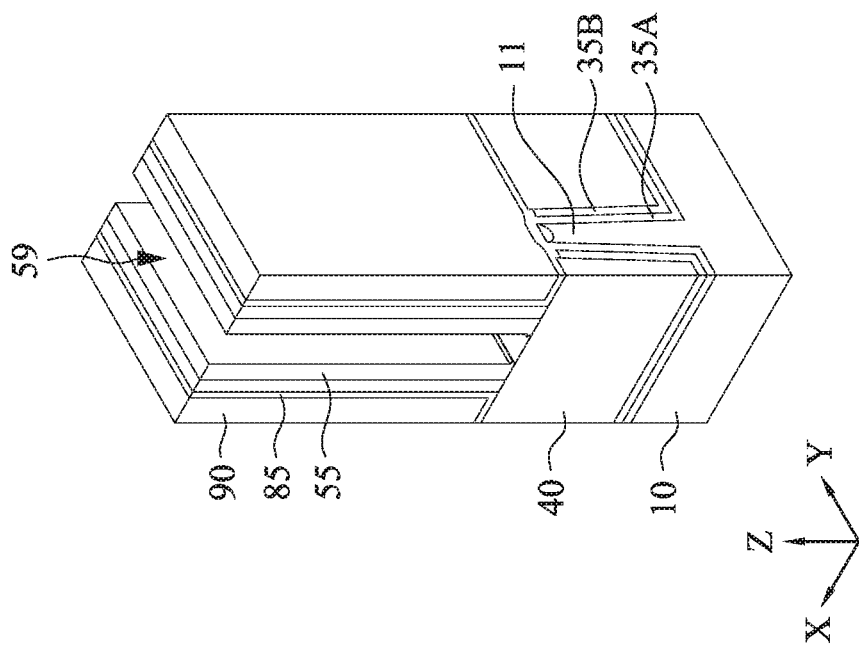

After the sacrificial gate structures are removed, the second semiconductor layers 25 in the channel region of the fin structures are removed, thereby forming wires of the first semiconductor layers 20, as shown in FIGS. 20A and 20B. FIG. 20A shows a perspective view and FIG. 20B shows a cross sectional view corresponding to line X1-X1 of FIG. 11A.

The second semiconductor layers 25 can be removed or etched using an etchant that can selectively etch the second semiconductor layers 25. When the first semiconductor layers 20 are Si and the second semiconductor layers 25 are Ge or SiGe, the first semiconductor layers 20 can be selectively removed using a wet etchant such as, but not limited to, tetramethylammonium hydroxide (TMAH), ethylenediamine pyrocatechol (EDP), or potassium hydroxide (KOH) solution.

Figure 21B:
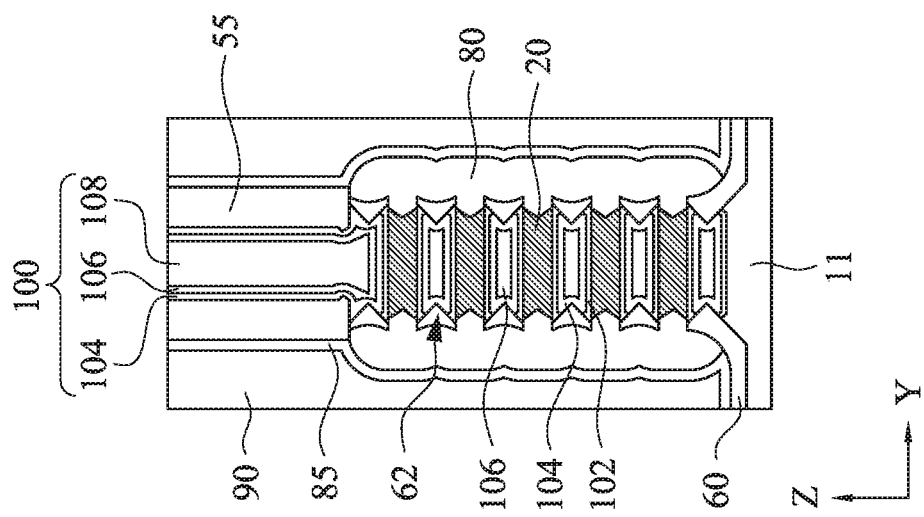
FIGS. 21A and 21B show views of one of the various stages of a sequential manufacturing process for a GAA FET device according to an embodiment of the present disclosure.
Figure 21A:
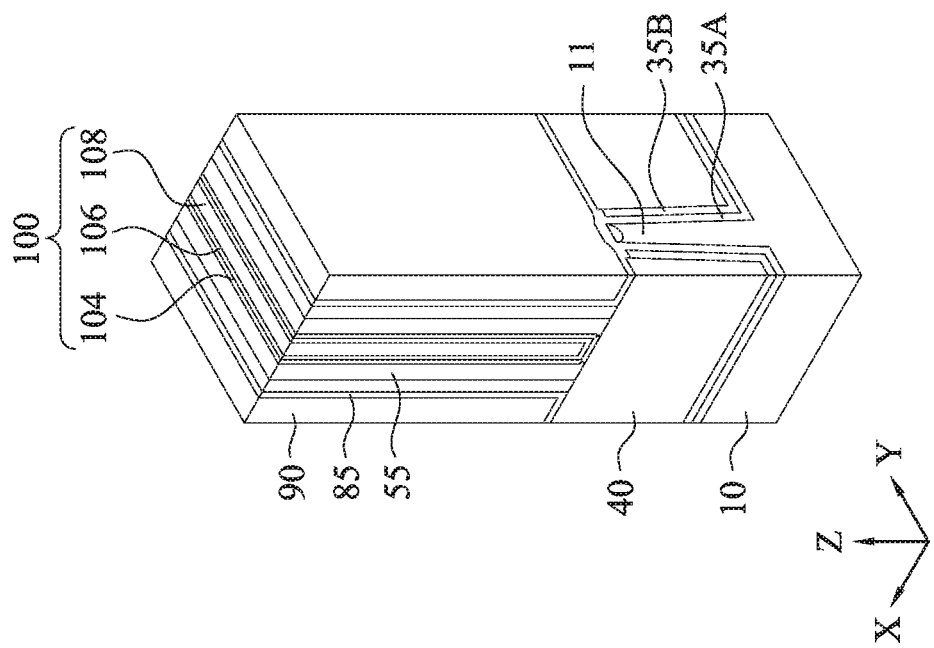

After the wires of the first semiconductor layers 20 are formed, a gate structure 100 is formed, as shown in FIGS. 21A and 21B. FIG. 21A shows a perspective view and FIG. 21B shows a cross sectional view corresponding to line X1-X1 of FIG. 11A. A gate dielectric layer 104 is formed around each channel layer (wires of the first semiconductor layers 20), and a gate electrode layer 108 is formed over the gate dielectric layer 104.

In certain embodiments, the gate dielectric layer 104 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, an interfacial layer 102 is formed between the channel layers and the gate dielectric layer 104. The gate dielectric layer 104 may be formed by CVD, ALD or any suitable method. In one embodiment, the gate dielectric layer 104 is formed using a highly conformal deposition process such as ALD in order to ensure the formation of a gate dielectric layer having a uniform thickness around each channel layer. The thickness of the gate dielectric layer 104 is in a range from about 1 nm to about 6 nm in one embodiment.

The gate electrode layer 108 is formed over the gate dielectric layer 104 to surround each channel layer in some embodiments. The gate electrode 108 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 108 may be formed by CVD, ALD, electroplating, or other suitable method. The gate electrode layer is also deposited over the upper surface of the ILD layer 90. The gate dielectric layer and the gate electrode layer formed over the ILD layer 90 are then planarized by using, for example, CMP, until the ILD layer 90 is revealed.

In certain embodiments, one or more work function adjustment layers 106 are interposed between the gate dielectric layer 104 and the gate electrode layer 108. The work function adjustment layers 106 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer. The work function adjustment layer 106 may be formed by ALD, PVD, CVD, e-beam evaporation, or other suitable process. Further, the work function adjustment layer 106 may be formed separately for the n-channel FET and the p-channel FET which may use different metal layers.

It is understood that the GAA FETs undergoes further CMOS processes to form various features such as contacts/vias, interconnect metal layers, dielectric layers, passivation layers, etc.

FIGS. 22A-31B show a sequential process for manufacturing a GAA FET device shown in FIGS. 2A-2D according to another embodiment of the present disclosure. It is understood that additional operations can be provided before, during, and after processes shown by FIGS. 22A-31B, and some of the operations described below can be replaced or eliminated, for additional embodiments of the method. The order of the operations/processes may be interchangeable.

FIG. 22A shows a perspective view and FIG. 22B shows a cross sectional view corresponding to line X1-X1 of FIG. 22A. In FIG. 22B the pad SiN layer 56 and the silicon oxide mask layer 58 are not shown.

After the structure shown in FIGS. 11A and 11B is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the gate sidewalls 55 of the sacrificial gate structure 50. Further, the insulating material 53 formed over the upper portions of the S/D region of the exposed fin structures 30 is also removed, as shown in FIGS. 22A and 22B. Thus, the stacked structure of the first semiconductor layers 20 and the second semiconductor layer 25 is exposed at the S/D region.

Figure 23B:
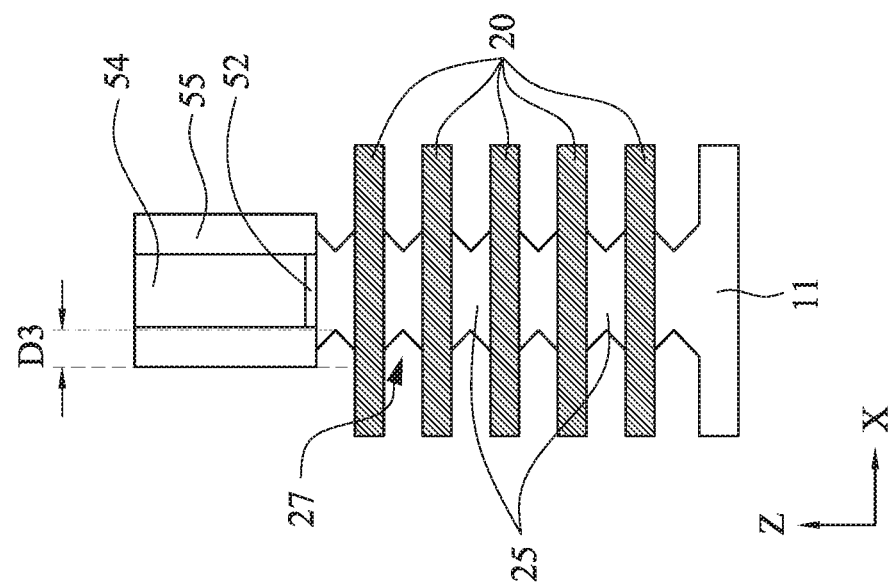
FIGS. 23A and 23B show views of one of the various stages of a sequential manufacturing process for a GAA FET device according to another embodiment of the present disclosure.
Figure 23A:
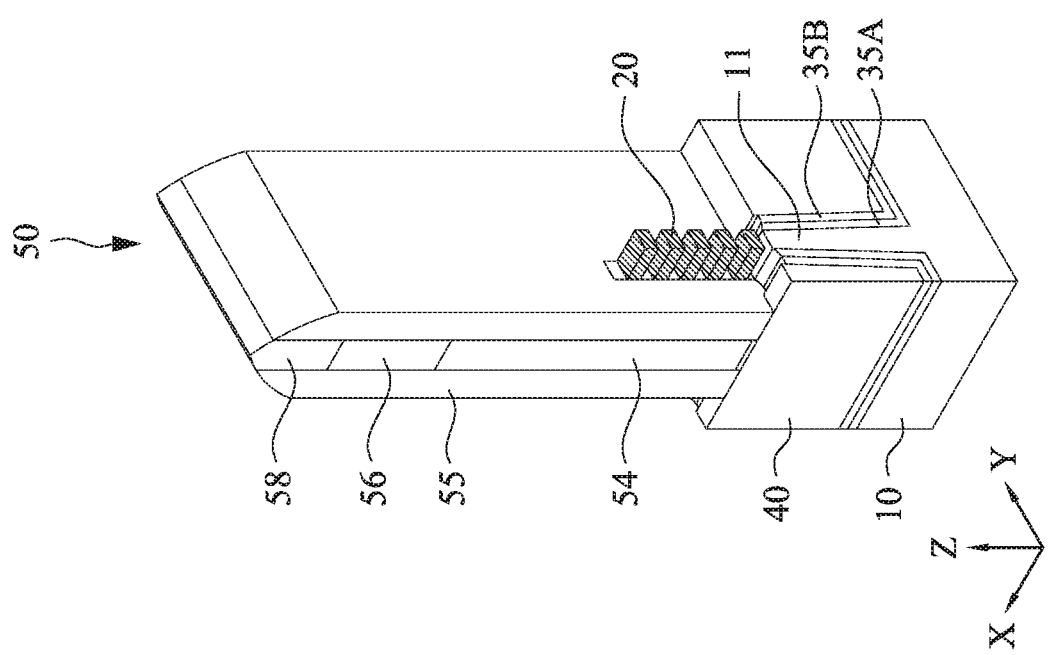

Then, as shown in FIGS. 23A and 23B, the second semiconductor layers 25 are horizontally recessed (etched) so that edges of the second semiconductor layers 25 are located substantially below the gate sidewall spacers 55 and cavities 27 are formed. FIG. 23A shows a perspective view and FIG. 23B shows a cross sectional view corresponding to line X1-X1 of FIG. 22A cutting the fin structure 30. In FIG. 23B the pad SiN layer 56 and the silicon oxide mask layer 58 are not shown. As shown in FIG. 23B, end portions (edges) of the second semiconductor layers 25 have a concave shape such as a V-shape or a U-shape in some embodiments. The depth D3 of the recessing of the second semiconductor layers 25 from the plane including one gate sidewall spacer 55 is in a range from about 5 nm to about 10 nm. The etching of the first semiconductor layer 25 includes wet etching and/or dry etching. A wet etchant such as a tetramethylammonium hydroxide (TMAH) solution can be used to selectively etch the second semiconductor layers 25 against the first semiconductor layer 20.

Then, as shown in FIGS. 24A and 24B, a dielectric material layer 60 is formed over the structure of FIGS. 23A and 23B. FIG. 24A shows a perspective view and FIG. 24B shows a cross sectional view corresponding to line X1-X1 of FIG. 22A cutting the fin structure 30. In FIG. 24B the pad SiN layer 56 and the silicon oxide mask layer 58 are not shown. In some embodiments, the dielectric material layer 60 includes a silicon nitride-based material, such as SiN, SiON, SiOCN or SiCN and combinations thereof and is different from the material of the gate sidewall spacers 55. In certain embodiments, the dielectric material is silicon nitride. The dielectric material layer 60 fully fills the cavities 27 and the spaces between adjacent first semiconductor layers 20, as shown in FIG. 24B. The dielectric material layer 60 can be formed using CVD, including LPCVD and PECVD, PVD, ALD, or other suitable processes.

Figure 25B:
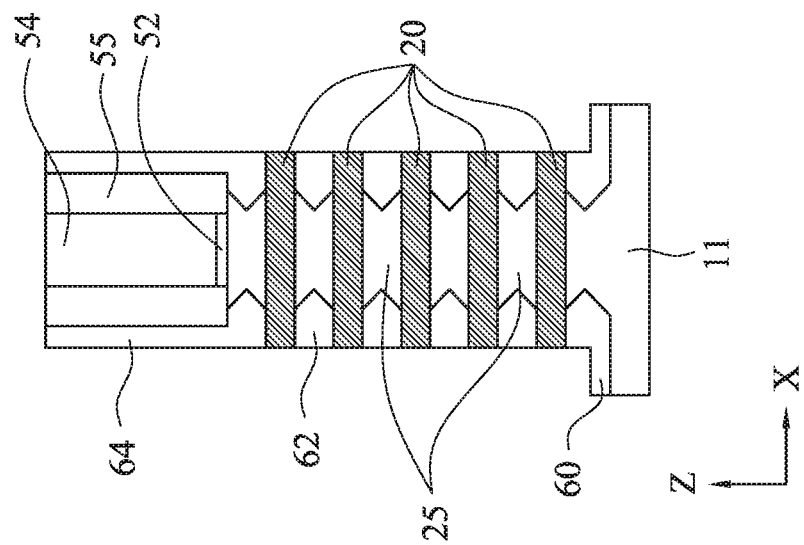
FIGS. 25A and 25B show views of one of the various stages of a sequential manufacturing process for a GAA FET device according to another embodiment of the present disclosure.
Figure 25A:
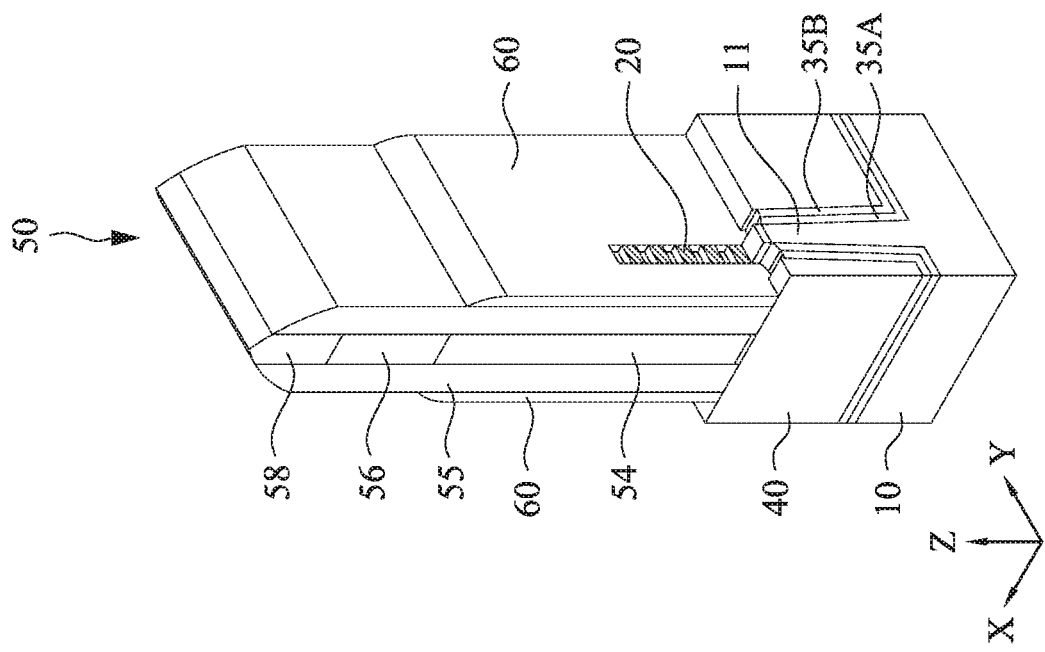

Next, as shown in FIGS. 25A and 25B, one or more etching operations are performed to form dielectric inner spacers 62. FIG. 25A shows a perspective view and FIG. 25B shows a cross sectional view corresponding to line X1-X1 of FIG. 22A. In FIG. 25B the pad SiN layer 56 and the silicon oxide mask layer 58 are not shown. The etching operations include one or more wet and/or dry etching operations. In certain embodiments, the etching is an isotropic etching in some embodiments. The maximum thickness along the Y direction of the dielectric inner spacers 62 is in a range from about 0.5 nm to about 5 nm in some embodiments. As shown in FIGS. 25A and 25B, a part of the dielectric material layer 60 remains over the bottom fin structure 11, and a part of the dielectric material 60 remains on the gate sidewall spacers 55 as second gate sidewall spacers 64. In some embodiments, the thickness of the second gate sidewall spacers 64 is in a range from about 2 nm to about 15 nm. The dielectric material layer 60 formed on the isolation insulating layer 40 is removed.

Figure 26B:
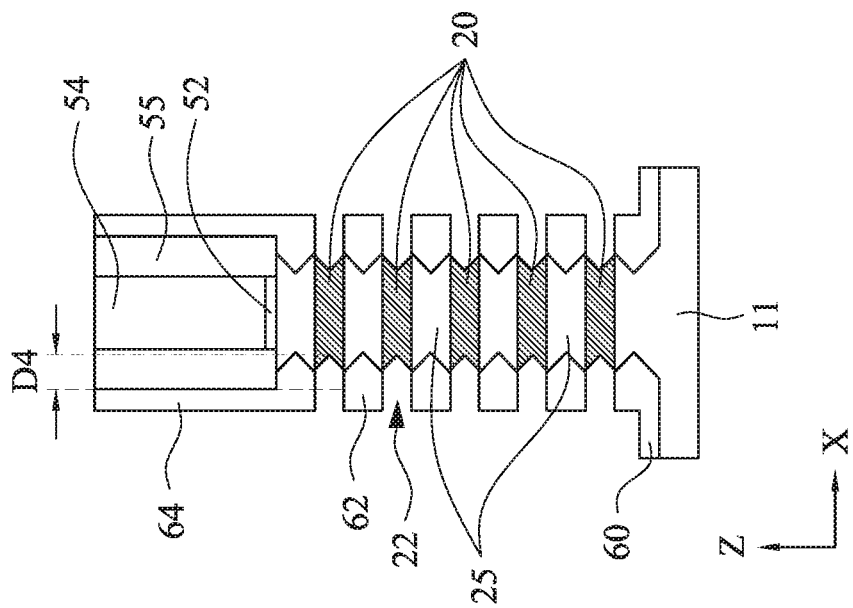
FIGS. 26A and 26B show views of one of the various stages of a sequential manufacturing process for a GAA FET device according to another embodiment of the present disclosure.
Figure 26A:
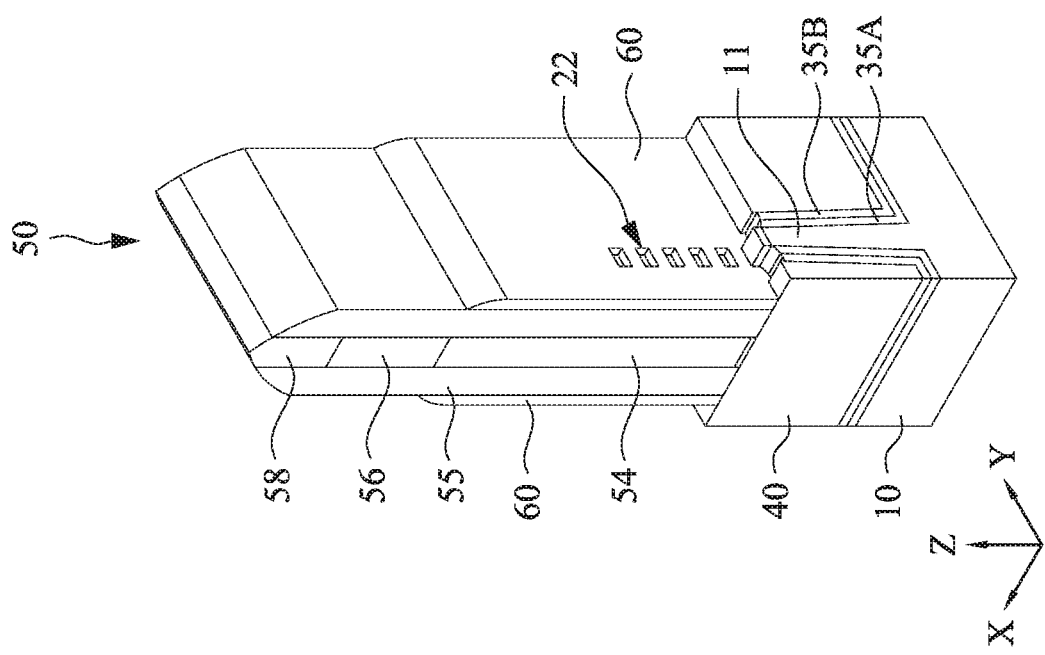

Subsequently, as shown in FIGS. 26A and 26B, the first semiconductor layers 20 are horizontally recessed (etched) so that edges of the first semiconductor layers 20 are located substantially below the gate sidewall spacers 55 and cavities 22 are formed. FIG. 26A shows a perspective view and FIG. 26B shows a cross sectional view corresponding to line X1-X1 of FIG. 22A. In FIG. 26B the pad SiN layer 56 and the silicon oxide mask layer 58 are not shown. As shown in FIG. 26B, end portions (edges) of the first semiconductor layers 20 have a concave shape such as a V-shape or a U-shape in some embodiments. The depth D4 of the recessing of the first semiconductor layers 20 from the plane including a surface of one gate sidewall spacer 55 is in a range from about 7 nm to about 15 nm. The etching of the first semiconductor layer 25 includes wet etching and/or dry etching. A wet etchant such as an ammonium hydroxide ($NH_4OH$), tetramethylammonium solution can be used to selectively etch the first semiconductor layers 20 against the second semiconductor layer 25. In some embodiments, D4 is greater than D3. As shown in FIG. 26A, the first semiconductor layers 20 are separated from the first gate sidewall spacers 55 and the second gate sidewall spacers 64 by this etching.

Figure 27B:
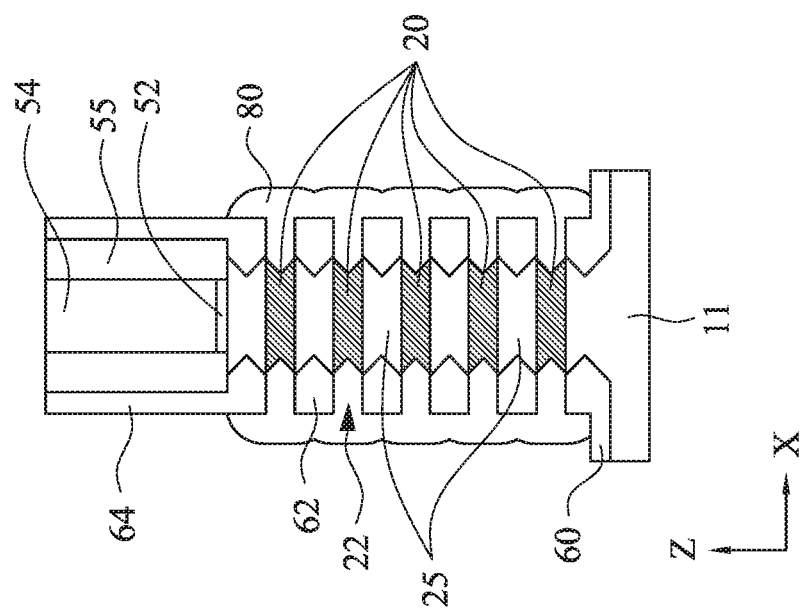
FIGS. 27A and 27B show views of one of the various stages of a sequential manufacturing process for a GAA FET device according to another embodiment of the present disclosure.
Figure 27A:
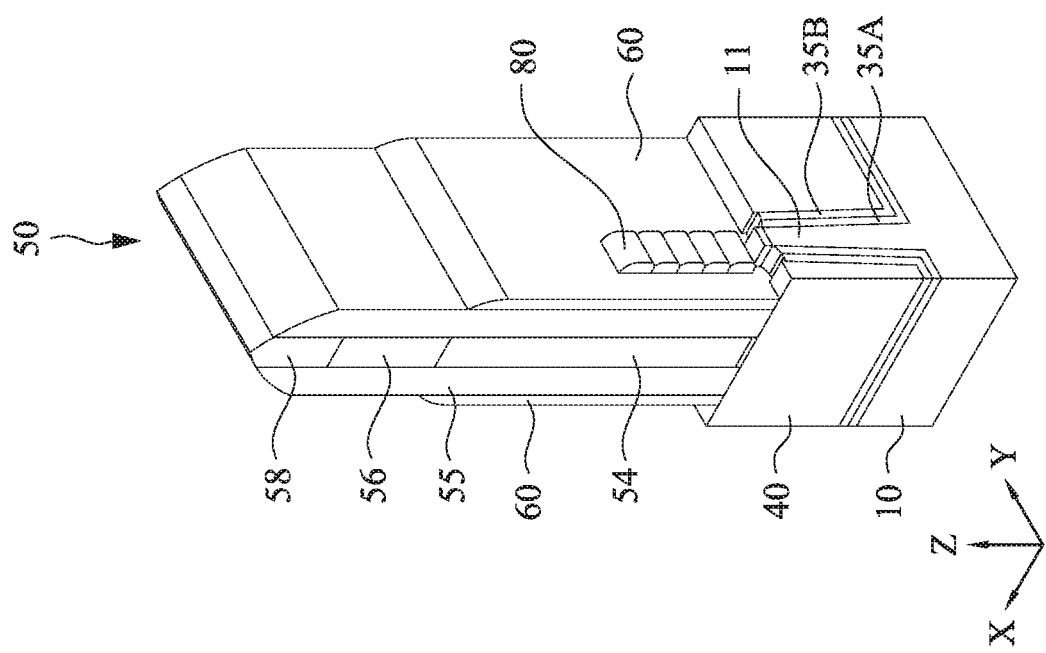

After the cavities 22 are formed, source/drain (S/D) epitaxial layers 80 are formed, as shown in FIGS. 27A and 27B. FIG. 27A shows a perspective view and FIG. 27B shows a cross sectional view corresponding to line X1-X1 of FIG. 22A. In FIG. 27B the pad SiN layer 56 and the silicon oxide mask layer 58 are not shown. The S/D epitaxial layer 80 includes one or more layers of Si, SiP, SiC and SiCP for an n-channel FET. The S/D epitaxial layers 80 are formed by an epitaxial growth method using CVD, ALD or molecular beam epitaxy (MBE). As shown in FIG. 27B, the interface between at least one of the first semiconductor layers 20 and the S/D epitaxial layer 80 is located under one of the gate sidewall spacers 55.

Figure 28B:
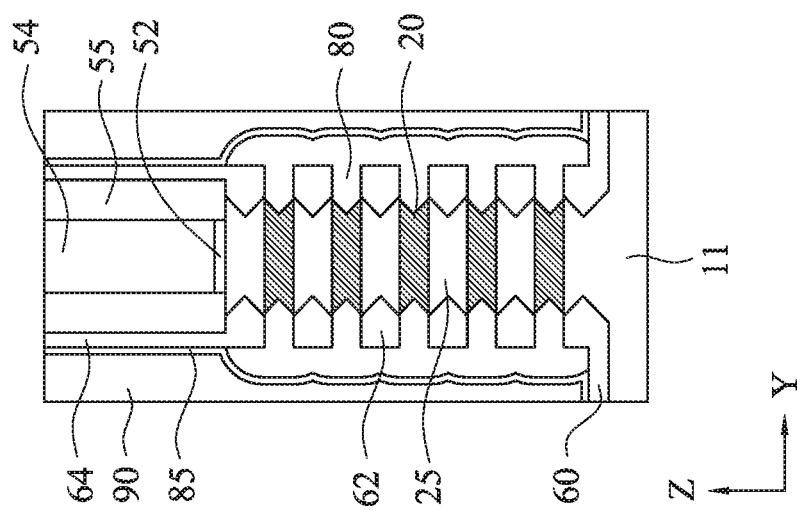
FIGS. 28A and 28B show views of one of the various stages of a sequential manufacturing process for a GAA FET device according to another embodiment of the present disclosure.
Figure 28A:
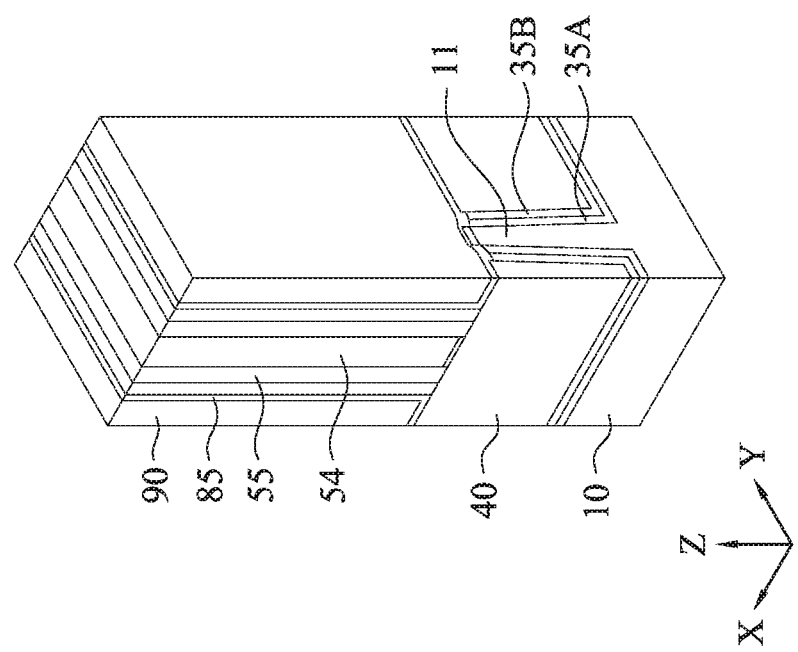

Subsequently, a liner layer 85 is formed and then an interlayer dielectric (ILD) layer 90 is formed, as shown in FIGS. 28A and 28B. FIG. 28A shows a perspective view and FIG. 28B shows a cross sectional view corresponding to line X1-X1 of FIG. 22A.

The liner layer 85 is made of a silicon nitride-based material, such as silicon nitride, and functions as a contact etch stop layer (CESL) in the subsequent etching operations. The materials for the ILD layer 90 include compounds comprising Si, O, C and/or H, such as silicon oxide, SiCOH and SiOC. Organic materials, such as polymers, may be used for the ILD layer 90. After the ILD layer 90 is formed, a planarization operation, such as CMP, is performed, so that the sacrificial gate electrode layer 54 is exposed, as shown in FIGS. 28A and 28B.

Figure 29B:
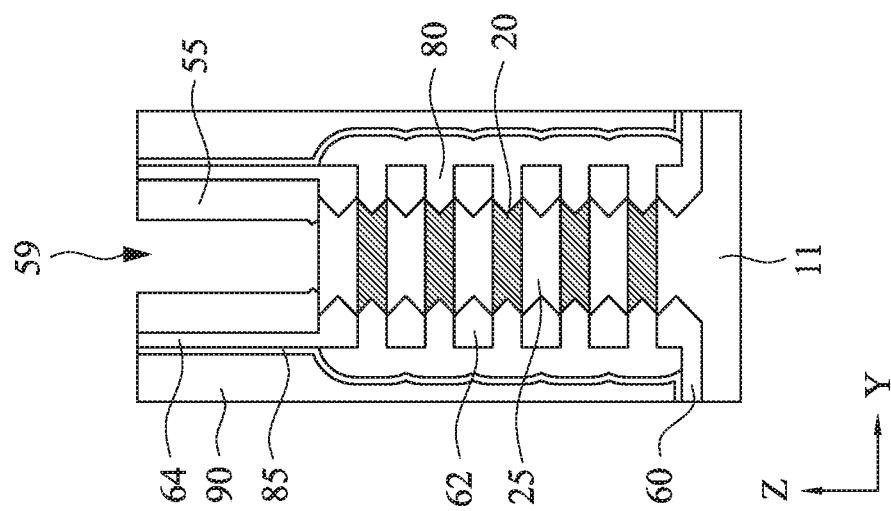
FIGS. 29A and 29B show views of one of the various stages of a sequential manufacturing process for a GAA FET device according to another embodiment of the present disclosure.
Figure 29A:
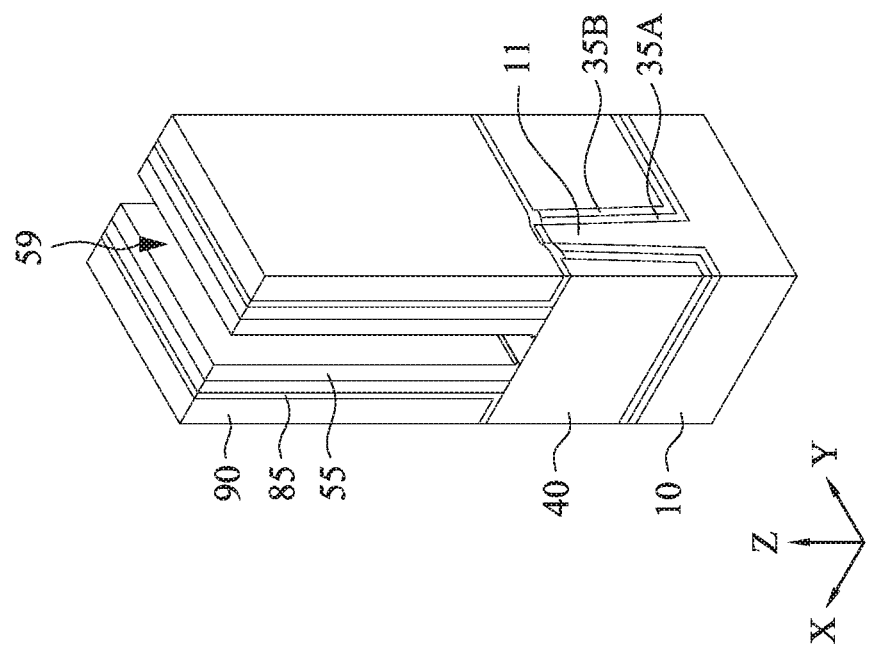

Next, as shown in FIGS. 29A and 29B, the sacrificial gate electrode layer 54 and sacrificial gate dielectric layer 52 are removed, thereby exposing a channel region of the fin structures. FIG. 29A shows a perspective view and FIG. 29B shows a cross sectional view corresponding to line X1-X1 of FIG. 22A. The ILD layer 90 protects the S/D epitaxial layers 80 during the removal of the sacrificial gate structures. The sacrificial gate structures can be removed using plasma dry etching and/or wet etching. When the sacrificial gate electrode layer 54 is polysilicon and the ILD layer 90 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 30B:
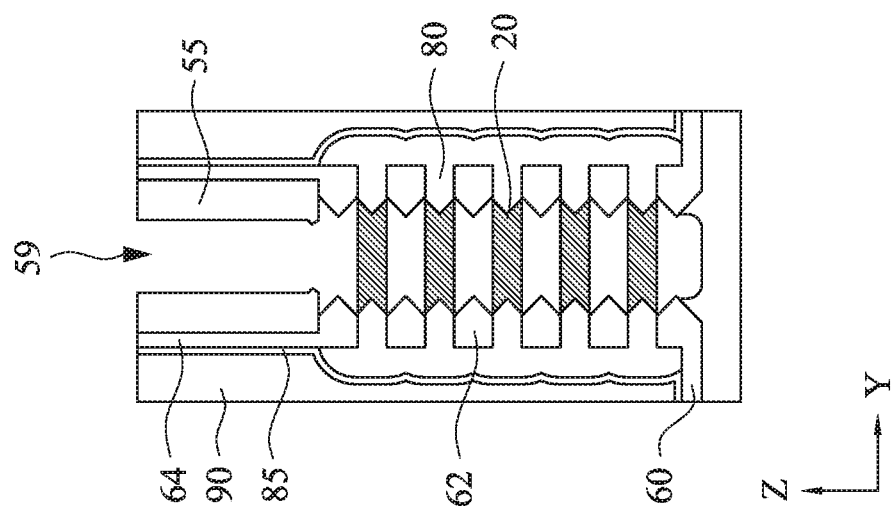
FIGS. 30A and 30B show views of one of the various stages of a sequential manufacturing process for a GAA FET device according to another embodiment of the present disclosure.
Figure 30A:
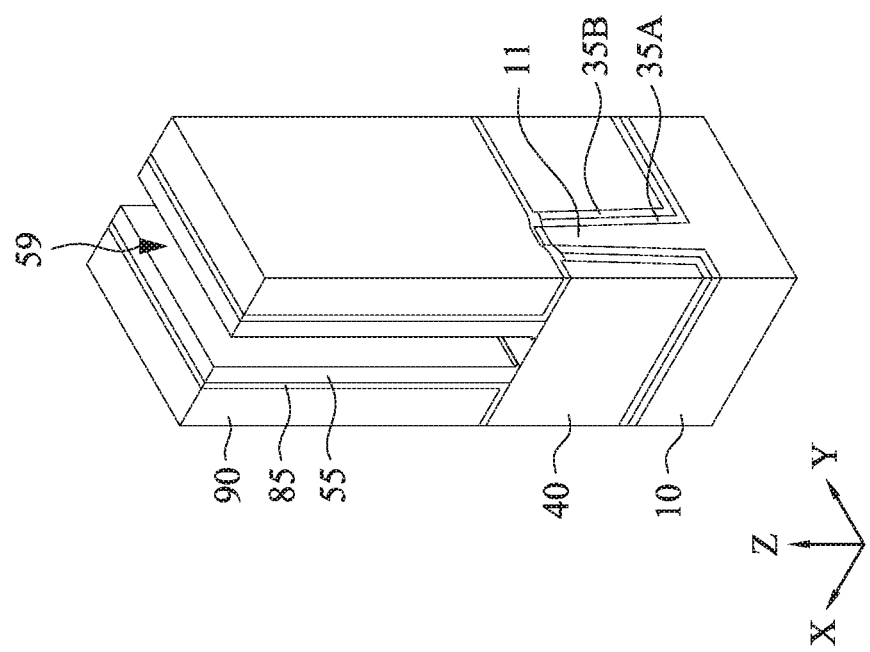

After the sacrificial gate structures are removed, the second semiconductor layers 25 in the channel region of the fin structures are removed, thereby forming wires of the first semiconductor layers 20, as shown in FIGS. 30A and 30B. FIG. 30A shows a perspective view and FIG. 20B shows a cross sectional view corresponding to line X1-X1 of FIG. 22A.

The second semiconductor layers 25 can be removed or etched using an etchant that can selectively etch the second semiconductor layers 25. When the first semiconductor layers 20 are Si and the second semiconductor layers 25 are Ge or SiGe, the first semiconductor layers 20 can be selectively removed using a wet etchant such as, but not limited to, tetramethylammonium hydroxide (TMAH), ethylenediamine pyrocatechol (EDP), or potassium hydroxide (KOH) solution.

Figure 31B:
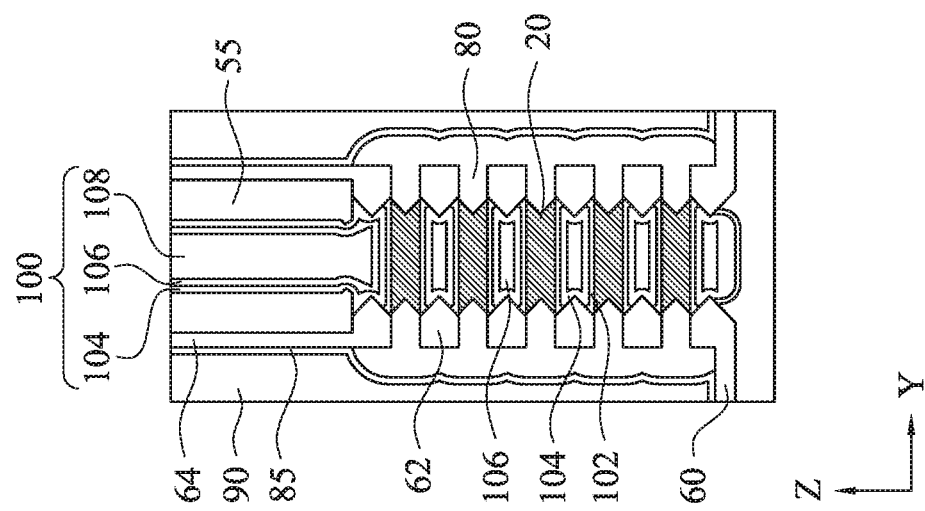
FIGS. 31A and 31B show views of one of the various stages of a sequential manufacturing process for a GAA FET device according to another embodiment of the present disclosure.
Figure 31A:
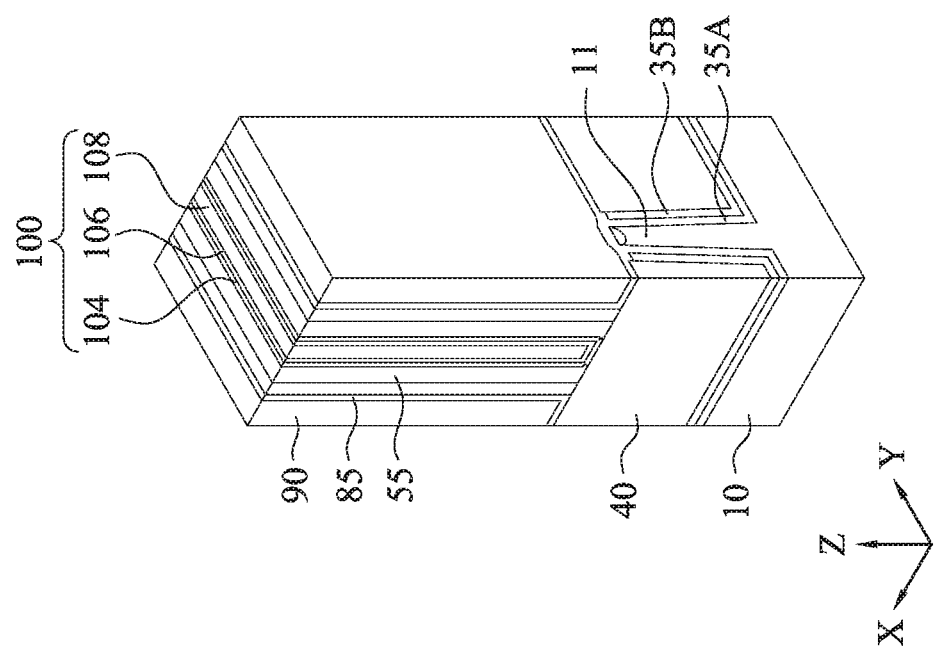

After the wires of the first semiconductor layers 20 are formed, a gate structure 100 is formed, as shown in FIGS. 31A and 31B. FIG. 31A shows a perspective view and FIG. 21B shows a cross sectional view corresponding to line X1-X1 of FIG. 31A. A gate dielectric layer 104 is formed around each channel layer (wires of the first semiconductor layers 20), and a gate electrode layer 108 is formed over the gate dielectric layer 104.

In certain embodiments, the gate dielectric layer 104 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, an interfacial layer 102 is formed between the channel layers and the gate dielectric layer 104. The gate dielectric layer 104 may be formed by CVD, ALD or any suitable method. In one embodiment, the gate dielectric layer 104 is formed using a highly conformal deposition process such as ALD in order to ensure the formation of a gate dielectric layer having a uniform thickness around each channel layer. The thickness of the gate dielectric layer 104 is in a range from about 1 nm to about 6 nm in one embodiment.

The gate electrode layer 108 is formed over the gate dielectric layer 104 to surround each channel layer in some embodiments. The gate electrode 108 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 108 may be formed by CVD, ALD, electroplating, or other suitable method. The gate electrode layer is also deposited over the upper surface of the ILD layer 90. The gate dielectric layer and the gate electrode layer formed over the ILD layer 90 are then planarized by using, for example, CMP, until the ILD layer 90 is revealed.

In certain embodiments, one or more work function adjustment layers 106 are interposed between the gate dielectric layer 104 and the gate electrode layer 108. The work function adjustment layers 106 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer. The work function adjustment layer 106 may be formed by ALD, PVD, CVD, e-beam evaporation, or other suitable process. Further, the work function adjustment layer 106 may be formed separately for the n-channel FET and the p-channel FET which may use different metal layers.

It is understood that the GAA FETs undergoes further CMOS processes to form various features such as contacts/vias, interconnect metal layers, dielectric layers, passivation layers, etc.

The various embodiments or examples described herein offer several advantages over the existing art. For example, in the present disclosure, the channels (semiconductor wires) are not in contact with gate sidewall spacers and the gate sidewall spacers are in contact with the source/drain epitaxial layer (SiP layer). Thus, it is possible to reduce interfacial state density (Dit) under the gate sidewall spacers. Further, by using a larger band gap material than the Ge or SiGe of the channels to contact the ends of the channels, it is possible to reduce Ge band-to-band channel leakage. In addition, since a remaining layer of the dielectric material layer is disposed at the bottom of the source/drain epitaxial layer, it is possible to reduce substrate leakage current.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure, in which first semiconductor layers and second semiconductor layers are alternately stacked, is formed over a bottom fin structure. A sacrificial gate structure having sidewall spacers is formed over the fin structure. The sidewall spacers is formed in a direction perpendicular to a major surface of a semiconductor substrate. A source/drain region of the fin structure, which is not covered by the sacrificial gate structure, is removed. The second semiconductor layers are laterally recessed. Dielectric inner spacers are formed on lateral ends of the recessed second semiconductor layers. The first semiconductor layers are laterally recessed. A source/drain epitaxial layer is formed to contact lateral ends of the recessed first semiconductor layer. The second semiconductor layers are removed thereby releasing the first semiconductor layers in a channel region. A gate structure is formed around the first semiconductor layers. In one or more of the foregoing and the following embodiments, an interface between at least one of the first semiconductor layers and the source/drain epitaxial layer is located under one of the sidewall spacers. In one or more of the foregoing and the following embodiments, the interface is located closer to the gate structure than a center line of the one of the sidewall spacers. In one or more of the foregoing and the following embodiments, the sidewall spacers are not in contact with the first semiconductor layers. In one or more of the foregoing and the following embodiments, the forming dielectric inner spacers includes forming a dielectric layer and etching the dielectric layer, and the source/drain epitaxial layer is separated from the bottom fin structure by a part of the dielectric layer. In one or more of the foregoing and the following embodiments, a material of the sidewall spacers is different from a material of the dielectric inner spacers. In one or more of the foregoing and the following embodiments, the material of the dielectric inner spacers is silicon nitride. In one or more of the foregoing and the following embodiments, the material of the sidewall spacers is one of SiOC, SiCON and SiCN. In one or more of the foregoing and the following embodiments, the first semiconductor layers are made of Ge or $Si_{1-x}Ge_x$, where $0.5 \leq x < 1$, and the second semiconductor layers are made of $Si_{1-y}Ge_y$, where $0.2 \leq y \leq 0.6$, and $x > y$.

In accordance with another aspect of the present disclosure, in a method of manufacturing a semiconductor device, a fin structure, in which first semiconductor layers and second semiconductor layers are alternately stacked, is formed over a bottom fin structure. A sacrificial gate structure having sidewall spacers is formed over the fin structure. The sidewall spacers is formed in a direction perpendicular to a major surface of a semiconductor substrate. The second semiconductor layers in a source/drain region of the fin structure, which is not covered by the sacrificial gate structure, are removed. A dielectric layer is formed. The dielectric layer and the first semiconductor layers in the source/drain region are etched, thereby forming dielectric inner spacers on lateral ends of the second semiconductor layers. The first semiconductor layers are laterally recessed. A source/drain epitaxial layer is formed to contact lateral ends of the recessed first semiconductor layer. The second semiconductor layers are removed thereby releasing the first semiconductor layers in a channel region. A gate structure is formed around the first semiconductor layers. In one or more of the foregoing and the following embodiments, an interface between at least one of the first semiconductor layers and the source/drain epitaxial layer is located under one of the sidewall spacers. In one or more of the foregoing and the following embodiments, the sidewall spacers are not in contact with the first semiconductor layers. In one or more of the foregoing and the following embodiments, a material of the sidewall spacers is different from a material of the dielectric inner spacers. In one or more of the foregoing and the following embodiments, the material of the dielectric inner spacers is silicon nitride. In one or more of the foregoing and the following embodiments, the material of the sidewall spacers is one of SiOC, SiCON and SiCN. In one or more of the foregoing and the following embodiments, the first semiconductor layers are made of Ge or $Si_{1-x}Ge_x$, where $0.5 \leq x < 1$ and the second semiconductor layers are made of $Si_{1-y}Ge_y$, where $0.2 \leq y \leq 0.6$, and $x > y$. In one or more of the foregoing and the following embodiments, a part of the dielectric layer remains on the sidewall spacers after the dielectric inner spacers are formed. In one or more of the foregoing and the following embodiments, the source/drain epitaxial layer is separated from the bottom fin structure by a part of the dielectric layer.

In accordance with another aspect of the present disclosure, in a method of manufacturing a semiconductor device, a fin structure, in which first semiconductor layers and second semiconductor layers are alternately stacked, is formed over a bottom fin structure. A sacrificial gate structure is formed over the fin structure. Sidewall spacers are formed on opposing side faces of the sacrificial gate structure. A source/drain region of the fin structure is removed. The second semiconductor layers are laterally recessed. Dielectric inner spacers are formed on lateral ends of the recessed second semiconductor layers. The first semiconductor layers are laterally recessed. A source/drain epitaxial layer is formed to contact lateral ends of the recessed first semiconductor layer. An interlayer dielectric layer is formed. The sacrificial gate structure is removed. The second semiconductor layers are removed, thereby releasing the first semiconductor layers in a channel region. A gate structure around the first semiconductor layers. In one or more of the foregoing and the following embodiments, a material of the sidewall spacers is different from a material of the dielectric inner spacers.

In accordance with one aspect of the present disclosure, a semiconductor device includes semiconductor wires vertically arranged, each of which has a channel region, a source/drain epitaxial layer connected to ends of the semiconductor wires, a gate structure having sidewall spacers formed around the semiconductor wires, and dielectric inner spacers disposed between the gate structure and the source/drain epitaxial layer. An interface between at least one of the semiconductor wires and the source/drain epitaxial layer is located under one of the sidewall spacers. In one or more of the foregoing and the following embodiments, the sidewall spacers are not in contact with the semiconductor wires. In one or more of the foregoing and the following embodiments, the interface is located closer to the gate structure than a center line of the one of the sidewall spacers. In one or more of the foregoing and the following embodiments, the ends of the semiconductor wires have a V-shape or U-shape cross section. In one or more of the foregoing and the following embodiments, a material of the sidewall spacers is different from a material of the dielectric inner spacers. In one or more of the foregoing and the following embodiments, the material of the dielectric inner spacers is silicon nitride. In one or more of the foregoing and the following embodiments, the material of the sidewall spacers is one of SiOC, SiCON and SiCN. In one or more of the foregoing and the following embodiments, the semiconductor wires are made of Ge or $Si_{1-x}Ge_x$, where 0.5≤x<1.0. In one or more of the foregoing and the following embodiments, the source/drain epitaxial lays includes SiP. In one or more of the foregoing and the following embodiments, an entirety of the dielectric inner spacers is located under the sidewall spacers.

In accordance with another aspect of the present disclosure, a semiconductor device includes semiconductor wires vertically arranged, each of which has a channel region, a source/drain epitaxial layer connected to ends of the semiconductor wires, a gate structure having first sidewall spacers formed around the semiconductor wires, dielectric inner spacers disposed between the gate structure and the source/drain epitaxial layer, and second sidewall spacers disposed on the first sidewall spacers. The first sidewall spacers are not in contact with the semiconductor wires. In one or more of the foregoing and the following embodiments, the second sidewall spacers are not in contact with the semiconductor wires. In one or more of the foregoing and the following embodiments, an interface between at least one of the semiconductor wires and the source/drain epitaxial layer is located under one of the first sidewall spacers. In one or more of the foregoing and the following embodiments, an interface between at least one of the dielectric inner spacers and the source/drain epitaxial layers is located outside a region under one of the first sidewall spacers. In one or more of the foregoing and the following embodiments, a material of the second sidewall spacers and a material of the dielectric inner spacers are the same. In one or more of the foregoing and the following embodiments, a material of the first sidewall spacers is different from the material of the dielectric inner spacers. In one or more of the foregoing and the following embodiments, the material of the dielectric inner spacers is silicon nitride. In one or more of the foregoing and the following embodiments, the material of the first sidewall spacers is one of SiOC, SiCON and SiCN.

In one or more of the foregoing and the following embodiments, the semiconductor wires are made of Ge or $Si_{1-x}Ge_x$, where 0.5≤x<1.0.

In accordance with another aspect of the present disclosure, a semiconductor device includes semiconductor wires vertically arranged, each of which has a channel region, a source/drain epitaxial layer connected to ends of the semiconductor wires, a gate structure having sidewall spacers formed around the semiconductor wires, and dielectric inner spacers disposed between the gate structure and the source/drain epitaxial layer. The sidewall spacers are not in contact with the semiconductor wires.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
semiconductor wires vertically arranged, each of which has a channel region;
a source/drain epitaxial layer connected to ends of the semiconductor wires;
a gate structure having sidewall spacers formed around the semiconductor wires;
and dielectric inner spacers disposed between the gate structure and the source/drain epitaxial layer, wherein;
an interface between at least one of the semiconductor wires and the source/drain epitaxial layer is located under one of the sidewall spacers, and
each of the ends of each of the semiconductor wires has a concave shape.

2. The semiconductor device of claim 1, wherein the sidewall spacers are not in contact with the semiconductor wires.

3. The semiconductor device of claim 1, wherein:
the semiconductor wires are disposed over a bottom fin structure, and
a dielectric layer made of a same material as the dielectric inner spacers is disposed between the source/drain epitaxial layer and the bottom fin structure.

4. The semiconductor device of claim 1, wherein the ends of the semiconductor wires have a V-shape or U-shape cross section.

5. The semiconductor device of claim 1, wherein a material of the sidewall spacers is different from a material of the dielectric inner spacers.

6. The semiconductor device of claim 5, wherein the material of the dielectric inner spacers is silicon nitride.

7. The semiconductor device of claim 5, wherein the material of the sidewall spacers is one of SiOC, SiCON and SiCN.

8. The semiconductor device of claim 1, wherein the interface is mis-aligned with an interface between the dielectric inner spacers and the gate structure.

9. The semiconductor device of claim 1, wherein each of the dielectric inner spacers has at least three planes having one plane and two planes perpendicular to the one plane.

10. The semiconductor device of claim 1, wherein an entirety of the dielectric inner spacers is located under the sidewall spacers.

11. A semiconductor device, comprising:
semiconductor wires vertically arranged over a bottom fin structure, each of which has a channel region;
a source/drain epitaxial layer connected to ends of the semiconductor wires;
a gate structure having first sidewall spacers formed around the semiconductor wires;
dielectric inner spacers disposed between the gate structure and the source/drain epitaxial layer; and
second sidewall spacers disposed on the first sidewall spacers, wherein:
the first sidewall spacers are not in contact with the semiconductor wires, and
an interface between at least one of the dielectric inner spacers and the source/drain epitaxial layers is located outside a region under one of the first sidewall spacers.

12. The semiconductor device of claim 11, wherein the second sidewall spacers are not in contact with the semiconductor wires.

13. The semiconductor device of claim 11, wherein an interface between at least one of the semiconductor wires and the source/drain epitaxial layer is located under one of the first sidewall spacers.

14. The semiconductor device of claim 11, wherein each of the ends of each of the semiconductor wires has a concave shape.

15. The semiconductor device of claim 11, wherein an interface between at least one of the semiconductor wires and the source/drain epitaxial layer is located closer to a center of the semiconductor device than an interface between the dielectric inner spacers and the gate structure.

16. The semiconductor device of claim 11, wherein an interface between the dielectric inner spacers and the gate structure is located closer to a center of the semiconductor device than an interface between at least one of the semiconductor wires and the source/drain epitaxial layer.

17. The semiconductor device of claim 11, wherein each of the dielectric inner spacers has at least three planes having one plane and two planes perpendicular to the one plane.

18. The semiconductor device of claim 11, wherein a material of the second sidewall spacers and a material of the dielectric inner spacers are the same.

19. A semiconductor device, comprising:
semiconductor wires vertically arranged, each of which has a channel region;
a source/drain epitaxial layer connected to ends of the semiconductor wires;
a gate structure having sidewall spacers formed around the semiconductor wires; and
dielectric inner spacers disposed between the gate structure and the source/drain epitaxial layer, wherein;
the sidewall spacers are not in contact with the semiconductor wires, and
each of the ends of each of the semiconductor wires has a concave shape.

20. The semiconductor device of claim 19, wherein each of the dielectric inner spacers has at least three planes having one plane and two planes perpendicular to the one plane.

* * * * *